United States Patent
Gonzalez Jimenez et al.

(10) Patent No.: US 9,484,933 B2
(45) Date of Patent: Nov. 1, 2016

(54) DEVICE FOR GENERATING FREQUENCY-STABLE SIGNALS WITH SWITCHABLE INJECTION-LOCKED OSCILLATOR

(71) Applicant: Commissariat a l'energie atomique et aux energies alternatives, Paris (FR)

(72) Inventors: Jose-Luis Gonzalez Jimenez, Voreppe (FR); Alexandre Siligaris, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/893,882

(22) PCT Filed: May 20, 2014

(86) PCT No.: PCT/EP2014/060362
§ 371 (c)(1),
(2) Date: Nov. 24, 2015

(87) PCT Pub. No.: WO2014/191259
PCT Pub. Date: Dec. 4, 2014

(65) Prior Publication Data
US 2016/0112054 A1 Apr. 21, 2016

(30) Foreign Application Priority Data
May 27, 2013 (FR) ..................... 13 54754

(51) Int. Cl.
*H03B 5/12* (2006.01)
*H03B 21/02* (2006.01)
(Continued)

(52) U.S. Cl.
CPC ............. *H03L 7/083* (2013.01); *H03B 5/1212* (2013.01); *H03B 5/1215* (2013.01);
(Continued)

(58) Field of Classification Search
CPC .. H03B 5/1228; H03B 5/1265; H03B 21/00; H03B 21/01; H03B 21/02; H03B 2200/0074; H03L 7/16; H03L 7/18; H03L 7/24; H04L 7/033
USPC .......................................... 331/18
See application file for complete search history.

(56) References Cited

U.S. PATENT DOCUMENTS 5,852,603 A 12/1998 Lehtinen et al.
6,867,656 B2 * 3/2005 Hajimiri ............... H03B 27/00
327/118
(Continued)

FOREIGN PATENT DOCUMENTS

EP 1 931 033 A2 6/2008

OTHER PUBLICATIONS

International Search Report Issued Jun. 17, 2014 for PCT/EP2014/060362 filed May 20, 2014.
(Continued)

*Primary Examiner* — Levi Gannon
(74) *Attorney, Agent, or Firm* — Oblon, McClelland, Maier & Neustadt, L.L.P.

(57) ABSTRACT

A device for generating at least one frequency-stable periodical signal, including: a generator configured to generate at least one first periodical signal with frequency spectrum that includes at least two lines at different frequencies $f_a$ and $f_b$; a first switchable injection-locked oscillator configured to receive at an input the first periodical signal and to be locked, in a first state, to the frequency $f_a$, and in a second state, to the frequency $f_b$, as a function of a value of at least one control signal applied at the input of the first switchable injection-locked oscillator.

13 Claims, 11 Drawing Sheets

(51) Int. Cl.
*H03L 7/18* (2006.01)
*H03L 7/24* (2006.01)
*H03L 7/083* (2006.01)
*H03L 7/099* (2006.01)
*H04L 7/033* (2006.01)

(52) U.S. Cl.
CPC ......... *H03B 5/1228* (2013.01); *H03B 5/1265* (2013.01); *H03B 21/02* (2013.01); *H03L 7/099* (2013.01); *H03L 7/18* (2013.01); *H03L 7/24* (2013.01); *H04L 7/033* (2013.01); *H03B 2200/0074* (2013.01)

(56) References Cited

U.S. PATENT DOCUMENTS

| | | | | |
|---|---|---|---|---|
| 8,577,305 | B1* | 11/2013 | Rossi | H04B 7/0413 327/115 |
| 8,976,901 | B2* | 3/2015 | Diao | H04L 27/20 375/295 |
| 9,231,596 | B2* | 1/2016 | Chen | H03B 5/1215 |
| 2008/0139150 | A1 | 6/2008 | Li et al. | |
| 2008/0285625 | A1 | 11/2008 | Chang et al. | |
| 2009/0027091 | A1* | 1/2009 | Yamaguchi | H03K 27/00 327/118 |
| 2009/0085682 | A1* | 4/2009 | Jang | H03B 19/14 331/117 FE |
| 2009/0102565 | A1* | 4/2009 | Jang | H03B 19/14 331/40 |
| 2010/0277207 | A1* | 11/2010 | Mahdavi | H03B 19/14 327/118 |
| 2010/0301955 | A1* | 12/2010 | Luong | H03B 19/00 331/117 FE |
| 2011/0006850 | A1* | 1/2011 | Shibasaki | H03L 7/0805 331/55 |
| 2011/0103526 | A1 | 5/2011 | Li et al. | |
| 2012/0161827 | A1 | 6/2012 | Madeira et al. | |
| 2012/0274409 | A1* | 11/2012 | Eldesouki | H03B 5/1228 331/109 |
| 2013/0141178 | A1* | 6/2013 | Soe | H03B 5/1228 331/117 FE |
| 2014/0266480 | A1* | 9/2014 | Li | H03B 5/1228 331/117 FE |

OTHER PUBLICATIONS

French Search Report Issued Feb. 18, 2014 for FR1354754 filed May 27, 2013.

Yang, et al.. "A 7 mW 2.5 GHz Spread Spectrum Clock Generator using Switch-Controlled Injection-Locked Oscillator," Circuits and Systems (ISCAS), 2013 IEEE International Symposium, pp. 1392-1395, XP032446188.

Katz, et al., "A fully integrated SiGe E-BAND transceiver chipset for broadband point-to-point communication," Radio and Wireless Symposium (RWS), 2012 IEEE, pp. 431-434.

Richard, el al., "A 17.5-to-20.94GHz and 35-to-41.88GHz PLL in 65nm CMOS for wireless HD applications," Solid-State Circuits Conference Digest of Technical Papers (ISSCC), 2010 IEEE international, pp. 252-253.

Tiebout et al., "A 50 GHz direct injection locked oscillator topology as low power frequency divider in 0.13 um CMOS," Solid-State Circuits Conference, 2003 ESSCIRC, pp. 73-76.

Siligaris, et al., "A 60 GHz UWB Impulse Radio Transmitter with Integrated Antenna in CMOS65nm SOI Technology," Silicon Monolithic Integrated Circuits in RF Systems (SiRF), 2011 IEEE, pp. 153-156.

* cited by examiner

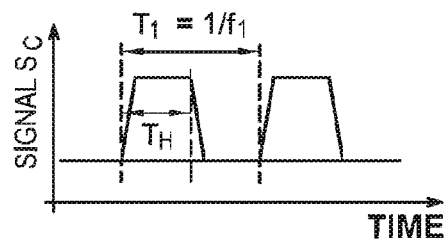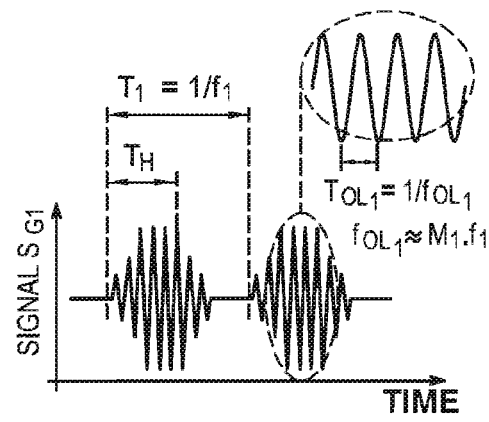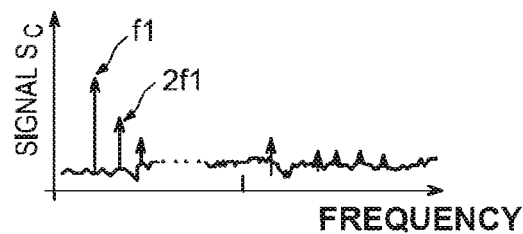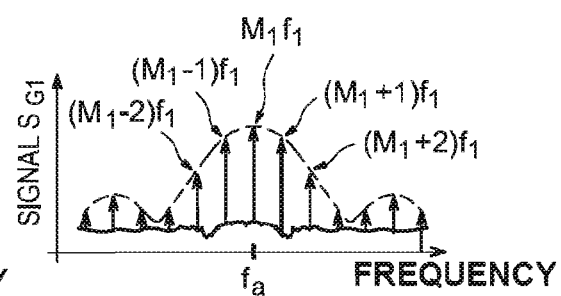
FIG. 4A    FIG. 5A
FIG. 4B    FIG. 5B

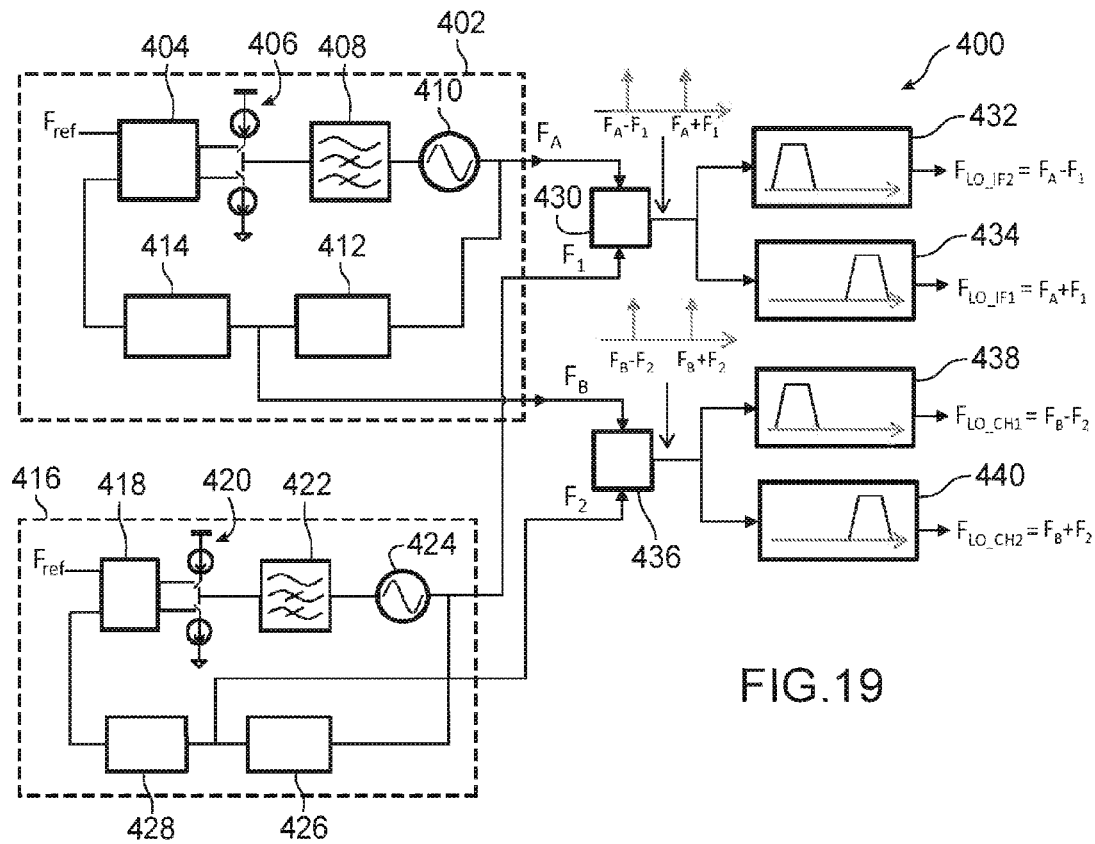
FIG.19
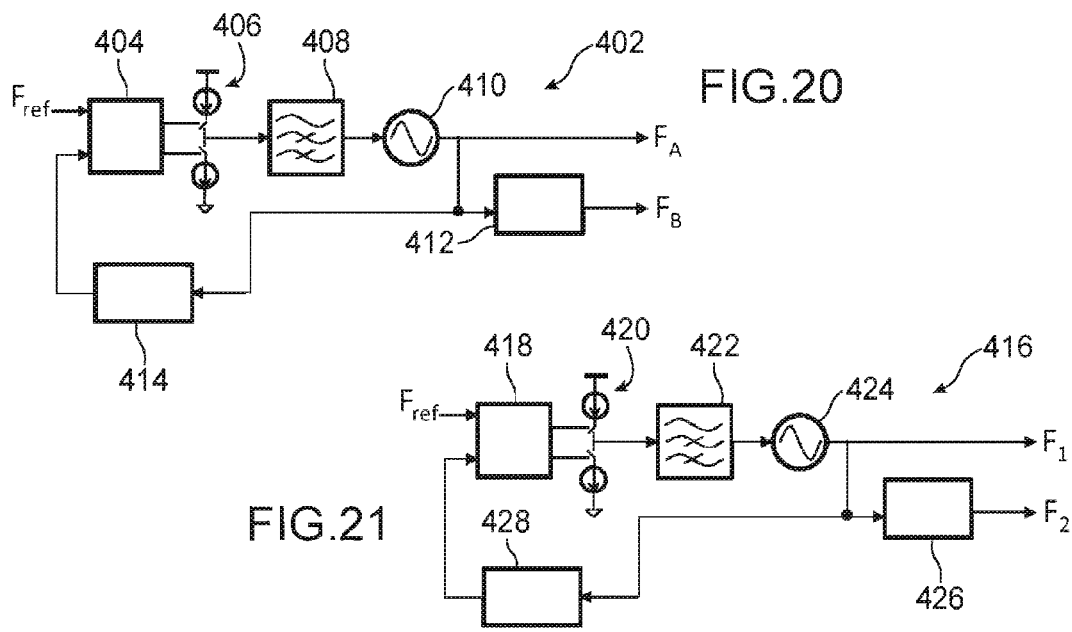
FIG.20
FIG.21

DEVICE FOR GENERATING FREQUENCY-STABLE SIGNALS WITH SWITCHABLE INJECTION-LOCKED OSCILLATOR

TECHNICAL FIELD

The invention relates to the field of devices for generating frequency-stable signals, used for example within transceiver devices, and in particular in wireless integrated RF transceiver devices involving several frequency-stable signals in the transmitting and receiving parts of these devices, for example for simultaneously performing transmission and reception of signals in at least two different frequency bands.

The invention is advantageously used in FDD ("Frequency Division Duplexing") type transceiver devices for example suitable for the E-Band communication standard.

STATE OF PRIOR ART

Some transceiver devices involve several frequency-stable signals for simultaneously performing transmission and reception of signals. When the transmission is to be made in a first frequency band and the reception is to be made in a second frequency band different from the first band, such a device generally includes two distinct signal generators each enabling a frequency-stable signal suitable for transmission or reception in the corresponding frequency bands to be generated, both generated signals being of different frequencies.

Moreover, it can be necessary, for some communication standards, to be able to switch over the transmission and reception frequency bands, which requires either to be able to output each of the generated signals to the transmitting and receiving parts of the device, or to be able to quickly change the frequency values of the generated signals.

For example, in the case of an "E-Band" type transceiver device, two frequency bands of 5 GHz around 70 GHz and 80 GHz are used for transmitting and receiving signals. Furthermore, such a device should be able to switch over both these frequency bands for transmission and reception.

Document of O. Katz et al., "A fully integrated SiGe E-BAND transceiver chipset for broadband point-to-point communication", Radio and Wireless Symposium (RWS), 2012 IEEE, pages 431-434, 15-18 Jan. 2012, describes an FDD type transceiver device suitable for the E-Band communication standard. To be able to simultaneously perform transmission and reception of signals in both different frequency bands and to be able to switch over both these bands, two PLL type distinct signal generators are used, and a device for switching over sending the output signals of both these generators in the transmitting and receiving parts is used.

Involving two distinct signal generators is an expensive, bulky solution which consumes a lot of electric energy. Moreover, in such a device, the duration for performing switching over of the transmission and reception frequency bands depends on the locking duration of the PLL, wherein this duration can be too long for some applications.

DISCLOSURE OF THE INVENTION

One purpose of the present invention is to provide a new type of device enabling at least one frequency-stable output signal to be generated and a change in the value of the frequency of the output signal to be readily and quickly made, and which does not have at least part of the drawbacks on the devices of the prior art.

For this, the present invention provides a device for generating at least one frequency-stable periodical signal, including at least:

a generator able to generate at least one first periodical signal the frequency spectrum of which includes at least two lines, or peaks, at the different frequencies $f_a$ and $f_b$;

a first switchable injection-locked oscillator able to receive at the input the first periodical signal and to be locked, in a first state, to the frequency $f_a$, and in a second state, to the frequency $f_b$, as a function of the value of at least one control signal applied at the input to the first switchable injection-locked oscillator.

The device according to the invention involves the locking proprieties of the injection-locked oscillator to one the frequencies of the signal applied at the input of this oscillator. The switchable injection-locked oscillator is used as a switchable band-pass filter applied to the first periodical signal the frequency spectrum of which includes at least two lines at different frequencies, thus corresponding to a multi-tone signal. Depending on the configuration, or on the switching state, wherein the switchable injection-locked oscillator is, the output signal of the device then includes only one of both these frequencies. Therefore, it is not necessary to involve two distinct devices to generate signals in two different frequency bands.

Moreover, the locking switching to either frequency of the injection-locked oscillator is quicker than for devices of prior art which require, at each frequency change, locking a PLL to the new frequency.

The lines at the frequencies $f_a$ and $f_b$ may have substantially similar amplitudes and/or be in phase with each other and/or correspond to two main lines of the frequency spectrum of the first periodical signal. Lines with similar amplitudes and/or in phase with each other enable the frequency-stable periodical signal generated to have a substantially constant amplitude and/or phase regardless of the frequency to which the oscillator is locked. The switches of the oscillator do not modify in this case the amplitude and/or phase of the output signal. The lines at the frequency $f_a$ and $f_b$ corresponding to main lines of the frequency spectrum of the first periodical signal facilitates locking the switchable oscillator to either line and avoids a locking of the oscillator to a possible other line of the frequency spectrum of the first periodical signal.

The characteristic according to which the lines at the frequencies $f_a$ and $f_b$ have substantially similar amplitudes may correspond to a difference in voltage of about 4 dB maximum between these amplitudes.

The first switchable injection-locked oscillator may include at least:

a resonating structure able to generate a second periodical signal oscillating, in the first state, at a first free oscillation frequency, for example close or substantially equal to $f_a$, and in the second state, at a second oscillation frequency, for example close or substantially equal to $f_b$, with a value different from that of the first free oscillation frequency;

an electrical element electrically coupled to the resonating structure and an impedance of which is equivalent to that of a negative electrical resistance;

an injection circuit electrically coupled to said electrical element, receiving at the input the first periodical signal and able to provide said electrical element with a current with a frequency equal to that of the first periodical signal.

In this case, the resonating structure of the first switchable injection-locked oscillator may include at least one LC resonating structure comprising the following components:

an inductor coupled in parallel, in the first state, to a first capacitor or, in the second state, to a second capacitor having an electric capacitance with a value different from that of the first capacitor, or a capacitor coupled in parallel, in the first state, to a first inductor or, in the second state, to a second inductor with a value different from that of the first inductor, or in the first state, a first inductor coupled in parallel with a first capacitor or, in the second state, a second inductor coupled in parallel to a second capacitor, the first inductor having a value different from that of the second inductor and the first capacitor having an electric capacitance with a value different from that of the second capacitor, and may further include switching elements able to modify the couplings of the components of the LC resonating circuit as a function of the control signal.

The electrical element of the first switchable injection-locked oscillator may include an MOS type differential twisted pair, and for example formed by two NMOS type transistors.

The injection circuit of the first switchable injection-locked oscillator may include at least:

a capacitor including a first terminal to which the first periodical signal is intended to be applied;

a resistor including a first terminal to which a DC bias voltage is intended to be applied and a second terminal electrically connected to a second terminal of the capacitor;

an MOS transistor a gate of which is electrically connected to the second terminal of the capacitor and a drain of which is electrically connected to the electrical element of the switchable injection locked oscillator.

The generator may include:

a phase-locked loop outputting a third periodical signal with a frequency $f_1$ and a fourth periodical signal with a frequency $f_2=f_1/N_1$, with $N_1$ higher than 1;

a frequency mixer receiving at the input the third periodical signal and the fourth periodical signal and outputting the first periodical signal such that $f_a=f_1-f_2$ and $f_b=f_1+f_2$.

Such a generator is cheaper, less bulky and consumes less energy than two PLL used for generating two signals with different frequencies.

Alternatively, the generator may include:

a phase-locked loop outputting a third periodical signal with a frequency $f_1$;

means able to receive at the input the periodical signal with a frequency $f_1$ and to generate at least two signals $S_{G1}$ and $S_{G2}$ in phase with each other and each corresponding to a train of oscillations with a frequency substantially equal to $f_a$ and $f_b$ respectively, with a duration lower than $T_1=1/f_1$ and periodically repeated at the frequency $f_1$, an adder able to output the first periodical signal corresponding to the sum of the signals $S_{G1}$ and $S_{G2}$.

Such a generator is generally cheaper, less bulky and consumes less energy than two PLL used for generating two signals with different frequencies.

Said means of the generator may include at least two voltage controlled oscillators the free oscillation ranges of which include the frequencies $f_a$ and $f_b$ respectively, and at least two switches connected at power supply inputs of the voltage controlled oscillators and able to be controlled by the periodical signal with the frequency $f_1$ such that they generate non-zero supply voltages of the voltage controlled oscillators only for part of each period $T_1$ or at least two switches connected to outputs of the voltage controlled oscillators and able to be controlled by the periodical signal with the frequency $f_1$ such that they break electrical connections between the outputs of the voltage controlled oscillators and inputs of the adder for part of each period $T_1$.

The advantage of the configuration in which the switches are connected to the power supply inputs of the voltage controlled oscillators is to not permanently operate the oscillators at a high frequency, and thus to reduce the energy consumption of the voltage controlled oscillators.

The device may further include at least one second switchable injection locked oscillator able to receive at the input the first periodical signal and to be locked in a first state to the frequency $f_b$ and in a second state to the frequency $f_a$, or to be locked in the first state to the frequency $f_a$ and in the second state to the frequency $f_b$, as a function of the control signal applied at the input of the first and second switchable injection locked oscillators. Such a device can thus output two signals with two equal or different frequencies, and advantageously with similar powers when the lines at the frequencies $f_a$ and $f_b$ of the frequency spectrum of the first periodical signal have a similar amplitude and/or are in phase with each other when the lines at the frequencies $f_a$ and $f_b$ of the frequency spectrum of the first periodical signal are in phase with each other.

The frequency spectrum of the first periodical signal may include at least n lines with n different frequencies, the device may further include n switchable injection-locked oscillators each able to receive at the input the first periodical signal and to be locked to each of the n frequencies as a function of the value of the controlled signal applied at the input of the n switchable injection-locked oscillators, n being an integer number higher than 1.

The device may further include at least one third switchable injection-locked oscillator able to receive at the input an output signal of the first or second switchable injection-locked oscillator or one of said n switchable injection locked oscillators, and to be locked to a frequency similar to that to which the switchable injection-locked oscillator is locked (the first or the second or one of the switchable injection-locked oscillators) to which the third switchable injection-locked oscillator is connected.

The invention also relates to a device for transmitting and/or receiving signals, including at least one device for generating a frequency-stable periodical signal as previously described coupled to a modulator and/or a demodulator of the transmitting and/or receiving device. Such a device may correspond to an integrated wireless RF transceiver device, for example of the FDD and E-Band type.

BRIEF DESCRIPTION OF THE DRAWINGS

The present invention will be better understood upon reading the description of exemplary embodiments given by way of purely indicative and in no way limiting purposes in reference to the appended drawings in which:

FIGS. 4A and 4B respectively show the waveform and the spectrum of a signal Sc obtained in a generator of a device for generating a frequency-stable signal, object of the present invention;

FIGS. 5A and 5B respectively show the waveform and the spectrum of a signal $S_{G1}$ obtained in a generator of a device for generating a frequency-stable signal, object of the present invention;

FIG. 19 shows an exemplary embodiment of a frequency synthesis device being part of a transmitting and/or receiving device, object of the present invention;

FIGS. 20 and 21 show alternative embodiments of a PLL of a frequency synthesis device being part of a transmitting and/or receiving device, object of the present invention;

Identical, similar or equivalent parts of the different figures described hereinafter bear the same reference numerals so as to facilitate switching from one figure to the other.

The different parts shown in the figures are not necessarily drawn according to a uniform scale, to make them more legible.

The different possibilities (alternatives and embodiments) should be understood as being not exclusive of each other and can be combined to each other.

DETAILED DISCLOSURE OF PARTICULAR EMBODIMENTS

Figure 1:
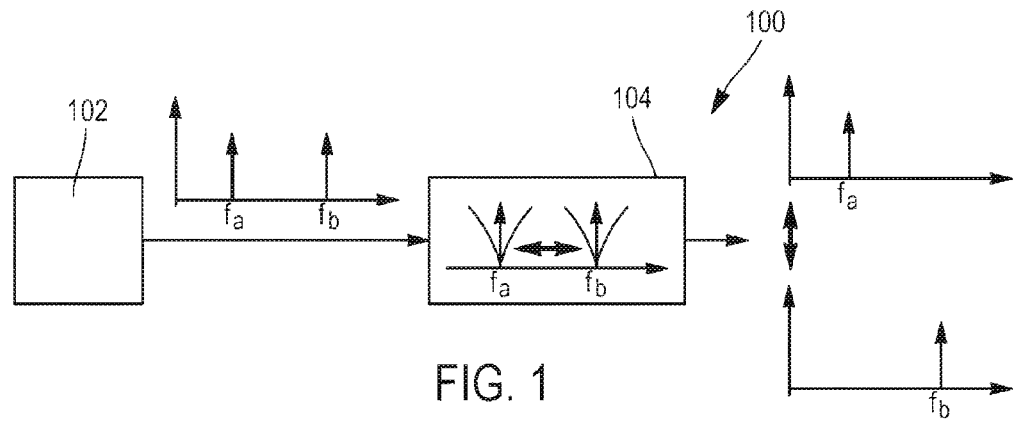
FIG. 1 schematically shows a device for generating a frequency-stable signal, object of the present invention, according to a first embodiment.

FIG. 1 is first referred to, which shows a device 100 for generating a frequency-stable periodical signal, and the frequency of the generated signal of which can be readily and quickly modified, according to a first embodiment.

The device 100 includes a generator 102 generating a first frequency-stable periodical signal the frequency spectrum of which includes two main lines at different frequencies, called $f_a$ and $f_b$, and the values of which correspond to the values that the frequency of the signal to be generated by the device 100 can assume. Advantageously, the generator 102 is such that the two main lines of the frequency spectrum of the first periodical signal have similar or substantially similar amplitudes, or powers (with for example a difference in voltage lower than or equal to about 4 dB). The device 100 also includes a switchable injection-locked oscillator 104, referred to as switchable ILO ("Injection-Locked Oscillator"), receiving at the input the first periodical signal.

The ILO 104 is switchable, that is includes a mechanism enabling it to modify its locking range, and thus to be locked to one of the frequencies $f_a$ and $f_b$ of the first periodical signal according to the configuration in which the switchable ILO 104 is. The signal obtained at the output of the switchable ILO 104, corresponding to the output signal of the device 100, is thus a frequency-stable periodical signal, for example a sinusoidal or substantially sinusoidal one, the frequency spectrum of which includes a single main line at the frequency $f_a$ or $f_b$ according to the configuration in which the switchable ILO 104 is put.

Figure 2:
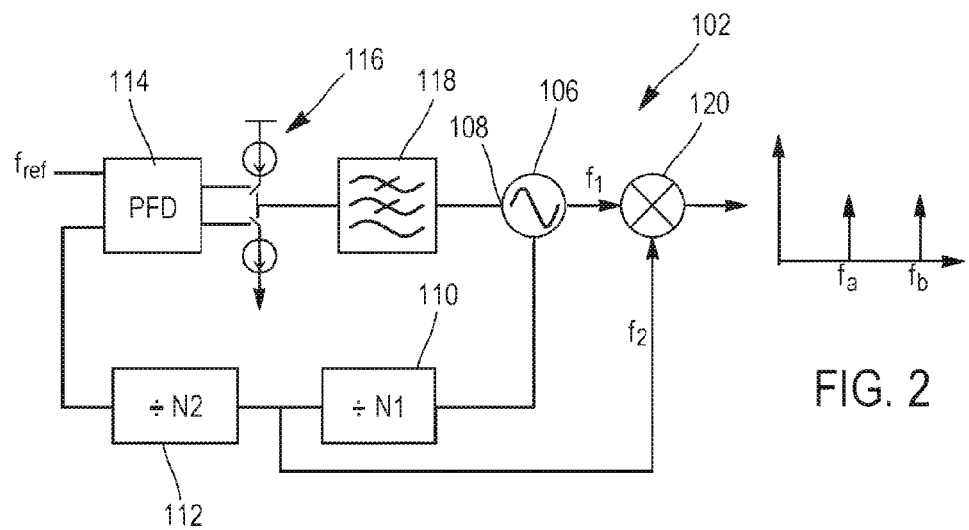
FIGS. 2 and 3 schematically show exemplary embodiments of a generator of a device for generating a frequency-stable signal, object of the present invention.

FIG. 2 shows a first exemplary embodiment of the generator 102.

The generator 102 includes an oscillator 106, for example of the VCO (Voltage Controlled Oscillator) type outputting a periodical signal $S_1$ with a frequency $f_1$, for example a sinusoidal signal with an oscillation frequency equal to $f_1$. The frequency $f_1$ value is controlled by a voltage applied to a control input 108 of the oscillator 106. In order to lock and stabilize the oscillation frequency $f_1$ of the signal $S_1$, the oscillator 106 is regulated within a phase-locked loop (PLL). This PLL includes a first frequency divider 110 able to divide the frequency $f_1$ of the signal $S_1$ by an integer or fractional number $N_1$ higher than 1. A periodical signal with a frequency $f_2=f_1/N_1$ is thus obtained at the output of the first frequency divider 110. This periodical signal with the frequency $f_2$ is sent at the input of a second frequency divider 112 able to divide the frequency $f_2$ by an integer or fractional number $N_2$ higher than 1. At the output of the second frequency divider 112, a periodical signal with the frequency $f_1/(N_1 \cdot N_2)$ is thus obtained, which is compared to another very stable reference periodical signal with a frequency $f_{ref}$, for example provided by a quartz resonator. The total division factor $(N_1 \cdot N_2)$ is chosen such that the frequency $f_1/(N_1 \cdot N_2)$ is close to the frequency $f_{ref}$ which is for example equal to 25 MHz, the factor $N_1 \cdot N_2$ being for example equal to about 2 400. A comparison between both these signals is made by a phase comparator 114 (PFD for <<Phase Frequency Detector>>) generating output signals proportional to the phase difference measured between both these signals, the values of which are positive or negative depending on the sign of the difference $f_1/(N_1 \cdot N_2)-f_{ref}$. These output signals are sent at the input of a charge pump circuit 116 and then of a low-pass filter 118 outputting the signal applied to the controlling input 108 of the oscillator 106 in order to adjust the oscillation frequency $f_1$, such that $f_1/(N_1 \cdot N_2)=f_{ref}$. The frequency-stable periodical signals with the frequencies $f_1$ and $f_2$ are then sent on inputs of a frequency mixer 120 outputting the first periodical signal the frequency spectrum of which includes lines at the frequencies $f_a$ and $f_b$, the values of which correspond to $f_a=f_1-f_2$ and $f_b=f_1+f_2$.

When the device 100 is intended to be used in an E-Band type transceiver device, the frequency $f_a$ is for example equal to about 55 GHz and the frequency $f_b$ equal to about 65 GHz. To obtain these frequencies, the PLL of the generator 102 is for example made such that the VCO 106 outputs a sinusoidal signal $S_1$ with the frequency $f_1=60$ GHz. By making the first frequency divider 110 such that $N_1=12$, the signal obtained at the output of the first frequency divider 110 corresponds to a sinusoidal signal with the frequency $f_2=5$ GHz. The frequency mixer 120 thus outputs the first periodical signal the frequency spectrum of which includes two main lines at the frequencies $f_a=f_1-f_2=55$ GHz and $f_b=f_1+f_2=65$ GHz.

According to a second exemplary embodiment, the generator 102 may correspond to two distinct PLLs the VCOs of which output the periodical signals with the frequencies $f_1$ and $f_2$, and a frequency mixer similar to the frequency mixer 120 previously described and receiving at the input the output signals of the VCO of both PLLs. A same reference signal with the frequency $f_{ref}$ may be applied at the input of both PLLs such that the periodical signals with the frequencies $f_1$ and $f_2$ are in phase with each other.

Figure 3:
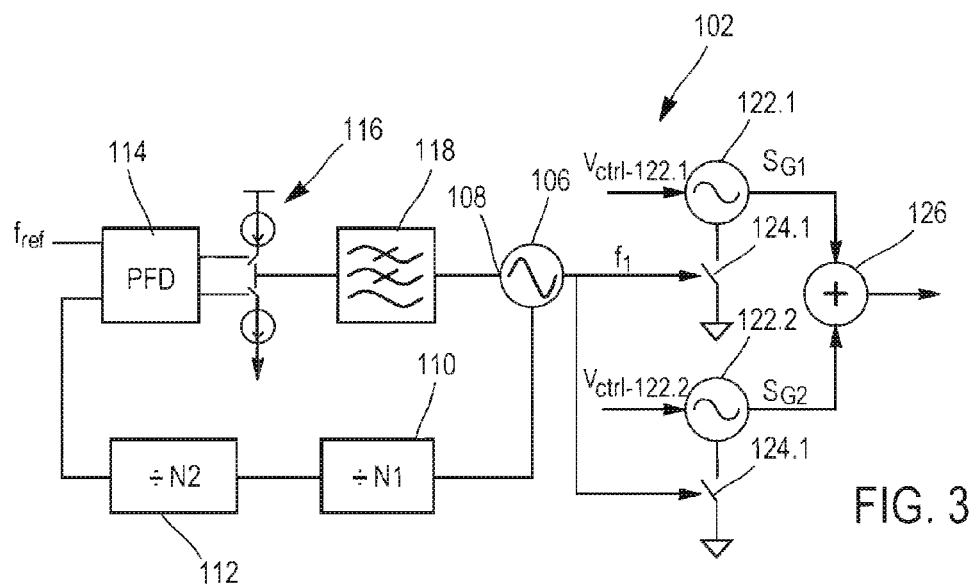

FIG. 3 shows a third exemplary embodiment of the generator 102.

As in the first exemplary embodiment of the generator 102 previously described in connection with FIG. 2, the generator 102 includes the VCO 106 regulated by a PLL formed by the elements 110, 112, 114, 116 and 118. These elements enable the periodical signal $S_1$, for example a sinusoidal signal, which is frequency-stable with a frequency $f_1$ to be obtained. Alternatively, it is possible to replace the VCO 106 and PLL by any device or structure able to provide such a frequency-stable periodical signal $S_1$, corresponding for example to a single resonator device when such a resonator device can directly provide the signal $S_1$. The choice of the type of device or structure generating the periodical signal $S_1$ can in particular be made as a function of the desired frequency $f_1$. A resonator device alone can be sufficient if the frequency $f_1$ does not exceed a value belong which it can then be necessary to involve a PLL for generating the signal $S_1$, for example for a frequency $f_1$ lower than about 500 MHz.

The generator 102 further includes two generators of periodically repeated oscillations train (PROT) at the frequencies $f_a$ and $f_b$.

Each PROT generator includes a VCO type oscillator 122.1, 122.2 voltage controlled by a control signal $V_{ctrl\_122.1}$, $V_{ctrl\_122.2}$, and controlled power supply means 124.1, 124.2 supplying power to the oscillator 122.1, 122.2 and which are controlled by the signal $S_1$. In the example of FIG. 3, this controlled power supply corresponds to a controlled current source operating as a switch periodically switching OFF (period $T_1=1/f_1$) the power supply to the oscillator 122.1, 122.2. This controlled current source may correspond to an MOS transistor including a gate to which the signal $S_1$ is applied.

Generally, these controlled power supply means 124.1, 124.2 may include a switch connected to a power supply input of the oscillator 122.1, 122.2 and able to be controlled by the periodical signal $S_1$.

The oscillators 122.1 and 122.2 are thus alternately switched ON and OFF by this switch, that is switching ON or OFF providing output signals by the oscillators 122.1 and 122.2, successively at frequency $f_1$. The oscillators 122.1 and 122.2 are thus controlled by a same signal $S_C$ corresponding to the currents generated by the current sources 124.1 and 124.2 (and thus to the supply voltages provided to the oscillators 122.1 and 122.2) and the wave form of which substantially corresponds to a positive square signal with the frequency $f_1$ (this square signal is not perfect and may have a trapezoidal shape, as is the case of the signal $S_C$ shown for example in FIG. 4A).

Thus, when the switching signal $S_C$ switches ON the oscillators 122.1 and 122.2, signals $S_{G1}$ and $S_{G2}$ corresponding to PROT are created at the outputs of the oscillators 122.1 and 122.2. A half-period $T_1/2$ (with $T_1=1/f_1$) later, the oscillators 122.1 and 122.2 are switched OFF and the oscillations are interrupted. The alternating ON and OFF states every half-period $T_1/2$ corresponds to the case where the signal $S_C$ has a duty cycle equal to 0.5. The signal $S_C$ shown in FIG. 4A switches ON the oscillators 122.1 and 122.2 for a duration $T_H$ which is equal, in this example, to $T_1/2$.

However, this duty cycle (equal to $T_H/T_1$) may be different from 0.5, and more generally between 0 and 1, the values 0 and 1 being excluded, the duration of the ON state may be higher or lower than that of the OFF state.

Thus, pulsed signals $S_{G1}$ and $S_{G2}$ are created at centre frequencies $f_{OL1}$ and $f_{OL2}$, corresponding to the free oscillation frequencies of the oscillators 122.1 and 122.2, with a repetition period equal to $T_1$. The signals $S_{G1}$ and $S_{G2}$ thus correspond to PROT, that is herein trains of oscillations with the frequency $f_{OL1}$ and $f_{OL2}$, with a duration lower than $T_1=1/f_1$ and periodically repeated with a repetition period equal to $T_1$.

The signals $S_{G1}$ and $S_{G2}$ thus periodically have a zero value over part of each period $T_1$, this part of each period $T_1$ approximately corresponding to the part of each period $T_1$ during which the signal $S_C$ has a zero value. The feature of the signals $S_{G1}$ and $S_{G2}$ is to have their phase-locked to that of the signal $S_1$ with the frequency $f_1$ provided by the oscillator 106 and have centre frequencies $f_{OL1}$ and $f_{OL2}$ which are substantially equal to integer multiples of $f_1$ ($f_{OL1} \approx M_1 \cdot f_1$ and $f_{OL2} = M_2 \cdot f1$). This property is due to the fact that at the start of the oscillations, the oscillators 122.1 and 122.2 have a high elasticity and are easily locked to harmonics $M_1$ and $M_2$ of the frequency $f_1$ with $M_1$ and $M_2$ such that the products $M_1 \cdot f_1$ and $M_2 \cdot f_1$ are closest to the free oscillation frequencies $f_{OL1}$ and $f_{OL2}$ of the oscillators 122.1 and 122.2. The $M_1$ and $M_2$ values, and thus those of the frequencies $f_{OL1}$ and $f_{OL2}$ depend on the values of the voltages $V_{ctrl\_122.1}$ and $V_{ctrl\_122.2}$ applied at the input of the oscillator 122.1 and 122.2, these values of the voltages $V_{ctrl\_122.1}$ and $V_{ctrl\_122.2}$ being chosen such that $M_1 \cdot f_1 = f_a$ and $M_2 \cdot f_1 = f_b$.

The equivalent spectrum of each of the signals $S_{G1}$ and $S_{G2}$ has an envelope the shape of which corresponds to a cardinal sin, or sinc, the components of which are sinusoids with the centre frequency $M_1 \cdot f_1$ and $M_2 \cdot f_1$ respectively. The lines of the frequency spectra of $S_{G1}$ and $S_{G2}$ are spaced from each other by $f_1$. FIGS. 4A and 4B respectively show the wave form (time domain) and the spectrum (frequency domain) of the signal Sc. Likewise, FIGS. 5A and 5B respectively show the wave form and the spectrum of the signal $S_{G1}$. In FIG. 5A, it can be seen that in each train of oscillations of the signal $S_{G1}$, the amplitudes of the oscillations are increasing upon starting the oscillator 114 and are decreasing upon stopping the oscillator 114. Moreover, the oscillations of the trains of oscillations of $S_{G1}$ are similar, in terms of phase, amplitude and frequency, from one train to the other. The frequency spectrum of the signal $S_{G1}$ thus includes a main line at the frequency $f_a = M_1 \cdot f_1$, and secondary lines (having amplitudes lower than that of the main line) at other frequencies multiples of $f_1$. The wave form and the frequency spectrum of the signal $S_{G2}$ are analogous to those of the signal $S_{G1}$, with a main line at the frequency $f_b = M_2 \cdot f_1$ and a free oscillation frequency $f_{OL2} \approx M_2 \cdot f_1 = f_b$.

From an analytical point of view, the signal $S_{G1}$ is obtained by convoluting in the time domain between a windowed sinus, with the frequency $f_{OL1}$ (corresponding to the free oscillation frequency of the oscillator 122.1) and with a window width equal to $T_H$, with $T_H \in ]0, T_1[$, and a Dirac comb with a period equal to $T_1$. The signal $S_{G1}$ can thus be expressed as:

$$S_G(t) = \left[ \sin(2 \cdot \pi \cdot f_{OL} \cdot t) \cdot \prod_{T_H}(t) \right] \otimes \sum_{k=-\infty}^{\infty} \delta(t - k \cdot T_1)$$

$\Pi_{T_H}(t)$ is the windowing function corresponding to:

$$\prod_{T_H}(t) = \begin{cases} 0 & \forall t < 0 \\ 1 & \forall t \in ]0, T_1[ \\ 0 & \forall t > T_H \end{cases}$$

The frequency spectrum of the signal $S_G$ corresponds in this case to:

$$|S_G(f)|_{f>0} = \left[ \frac{1}{2} \delta(f - f_{OL}) \otimes T_H \cdot \text{sinc}(\pi \cdot f \cdot T_H) \right] \cdot f_1 \cdot \sum_{k=-\infty}^{\infty} \delta(f - k \cdot f_1)$$

For each of the lines of frequencies $f_j$ of the spectrum of the signal $S_G$ ($f_j$ being multiples of $f_1$), the amplitude $A_j$ of each of these lines can be expressed by the equation:

$$A_j = \frac{1}{2} \sin c(\pi(f_j - f_{OL}) \cdot T_H)$$

Analogous equations are applied for the signal $S_{G2}$, the term $f_{OL1}$ used in the above equations being then replaced by the term $f_{OL2}$.

Figure 6:
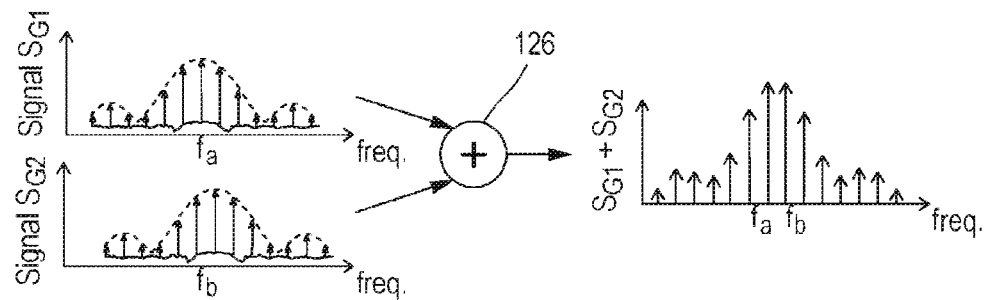
FIG. 6 shows the addition of frequency spectra of the signals $S_{G1}$ and $S_{G2}$ made in a generator of a device for generating a frequency-stable signal, object of the present invention.

The signals $S_{G1}$ and $S_{G2}$ are then added by an adder 126 receiving at the input the signals $S_{G1}$ and $S_{G2}$ outputted by the oscillators 122.1 and 122.2. FIG. 6 symbolically shows the addition of the frequency spectra of the signals $S_{G1}$ and $S_{G2}$ made by the adder 126. The frequency spectrum of the signal obtained at the output of the adder 126 thus includes two main lines at the frequencies $f_a$ and $f_b$ corresponding to the main lines of the frequency spectra of the signals $S_{G1}$ and $S_{G2}$. In the example of this figure, the frequencies $f_a$ and $f_b$ are consecutive integer multiples of $f_1$ such that $f_b = f_a + f_1$, and thus with $M_2 = M_1 + 1$, and the lines at the frequencies $f_a$ and $f_b$ are of the same amplitude. Because the signals $S_{G1}$ and $S_{G2}$ are generated from the same signal $S_1$, these signals thus have their phase coherent with each other.

In an alternative embodiment of the generator 102 described in connection with FIG. 3, the oscillators 122.1 and 122.2 may be not controlled by a periodically interrupted supply source, but continuously supplied, providing sinusoidal signals with the frequencies $f_{OL1}$ and $f_{OL2}$. These signals are then sent at the input of switches controlled by the periodical signal $S_1$. These switches are thus periodically (period $T_1$) in a closed position for a duration equal to $T_H$ (for example equal to $T_1/2$ in the case of a duty cycle equal to 0.5) and in an open position for a duration equal to $T_1 - T_H$.

In this case, at the output of these switches, PROT type signals $S_{G1}$ and $S_{G2}$ are obtained, that is of the type train of oscillations with the frequency $f_{OL1}$ or $f_{OL2}$ periodically repeated with a repetition period equal to $T_1$. The oscillations of each of the trains of oscillations of $S_{G1}$ and $S_{G2}$ are thus not generally similar, in terms of phase, from one train to the other, but on the other hand the signals $S_{G1}$ and $S_{G2}$ are in phase with each other.

In this case, from an analytical point of view, the signal $S_{G1}$ corresponds to the product of a sinus with the frequency $f_{OL1}$ and a periodical square signal with the period $T_1$ and a duration in the high state $T_H$ with $T_H \in ]0, T_1[$ such that:

$$S_{G1}(t) = \sin(2 \cdot \pi \cdot f_{OL1} \cdot t) \cdot \left[ \prod_{T_H}(t) \otimes \sum_{k=-\infty}^{\infty} \delta(t - k \cdot T_1) \right]$$

The frequency spectrum of the signal $S_{G1}$ corresponds in this case to:

$$|S_{G1}(f)|_{f>0} = \frac{1}{2} \delta(f - f_{OL1}) \otimes \left[ T_H \cdot \text{sinc}(\pi \cdot f \cdot T_H) \cdot f_1 \cdot \sum_{k=-\infty}^{\infty} \delta(f - k \cdot f_1) \right]$$

Analogous equations are applicable for the signal $S_{G2}$, the term $f_{OL1}$ used in the equations above being then replaced by the term $f_{OL2}$.

Figure 7:
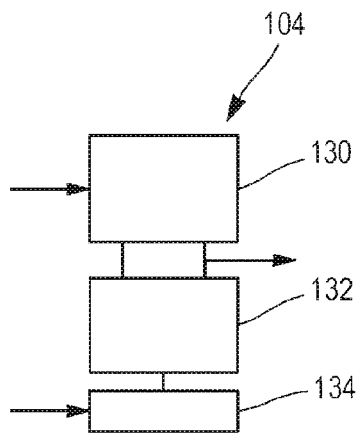
FIG. 7 schematically shows a switchable injection-locked oscillator of a device for generating a frequency-stable signal, object of the present invention.

FIG. 7 which schematically shows the switchable ILO 104 is now referred to. The switchable ILO 104 includes a resonating structure 130, an electrical element 132 the electrical impedance of which is equivalent to that of a negative electrical resistance (that is at the terminals of which a voltage increases when the current flowing therethrough decreases, and conversely at the terminals of which a voltage decreases when the current flowing therethrough increases), and an injection circuit 134 to receive at the input the first periodical signal to which the switchable ILO 104 is intended to be locked.

The resonating structure 130 can be configured into two states: a first state such that the value of the free oscillation frequency of the switchable ILO 104 is equal or close to that of the frequency $f_a$, and a second state such that the value of the free oscillation frequency of the switchable ILO 104 is equal or close to that of the frequency $f_b$. Switching from one state to the other for the resonating structure 130 is made through a control signal applied at the input of the resonating structure 130.

When no signal is applied to the input of the injection circuit 134, the switchable ILO 104 oscillates at the free oscillation frequency the value of which depends on the state in which the resonating structure 130 is. When a signal with a sufficient amplitude and a frequency close to the free oscillation frequency of the switchable ILO 104 is applied at the input of the injection circuit 134, the switchable ILO 104 is then locked to this signal and the frequency of the signal outputted by the switchable ILO 104 does not correspond to its free oscillation frequency but is equal to the frequency of the signal applied at the input of the injection circuit 134.

Figure 8:
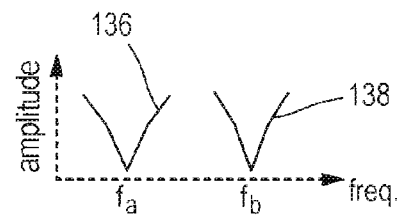
FIG. 8 shows locking ranges of a switchable injection-locked oscillator of a device for generating a frequency-stable signal, object of the present invention.

As shown in FIG. 8, the locking range of the switchable ILO 104 has a shape approximating a "V" the tip, or end of which is located at the free oscillation frequency of the switchable ILO 104. In this FIG. 8, a first locking range 136 is shown for the case where the resonating structure 130 is in the first state (for which the free oscillation frequency is close or equal to $f_a$), and a second locking range 138 is shown for the case where the resonating structure 130 is in the second state (for which the free oscillation frequency is close or equal to $f_b$). These locking ranges indicate the minimum amplitude value of the signal applied at the input of the injection circuit 134, as a function of the frequency of this signal, for which the switchable ILO 104 is locked and outputs in this case a signal with a frequency equal to that of the signal applied at the input of the injection circuit 134. The required amplitude for locking the switchable ILO 104 is reduced as the frequency of the signal applied at the input of the injection circuit 134 is close to the free oscillation frequency of the ILO 104, and thus close to $f_a$ when the resonating structure is in the first state and close to $f_b$ when the resonating structure is in the second state.

Figure 9:
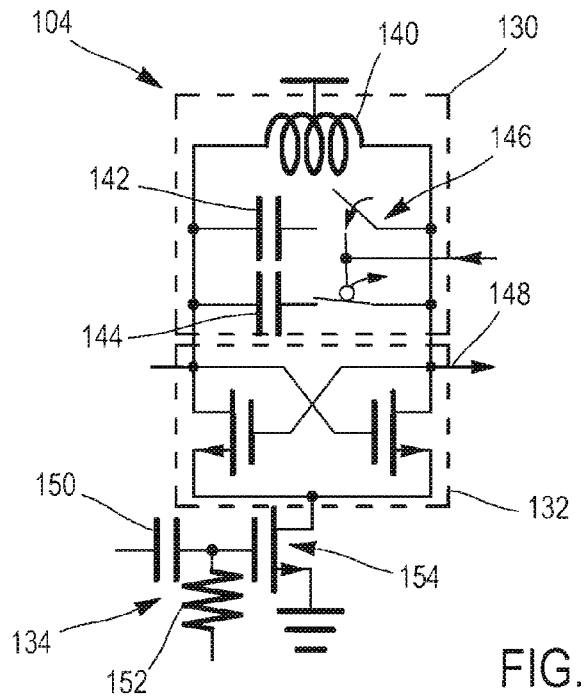
FIG. 9 schematically shows an exemplary embodiment of a switchable injection-locked oscillator of a device for generating a frequency-stable signal, object of the present invention.

FIG. 9 schematically shows an exemplary embodiment of the switchable ILO 104. The resonating structure 130 includes an inductor 140 coupled in parallel with a first capacitor 142 and a second capacitor 144. The value of the electric capacitance of the first capacitor 142 is different from that of the second capacitor 144.

The resonating structure 130 also includes two switches 146 operating complementarily with respect to each other (one of both switches being in a closed position when the other of both switches is in an open position). The switches 146 are controlled by the control signal applied at the input of the resonating structure 130. Thus, the resonating structure 130 forms an LC resonating circuit which includes, in the first state, the inductor 140 and the first capacitor 142, and in the second state, the inductor 140 and the second capacitor 144. The LC resonating structure formed by the resonating structure 130 thus includes the first capacitor 142 or the second capacitor 144 depending on the value of the control signal applied at the input of the resonating structure 130, and the free oscillation frequency of the switchable ILO 104 is thus modified depending on the elements forming this LC resonating circuit.

Alternatively, the resonating structure 130 may include a single capacitor coupled to a first inductor in the first state and to a second inductor in the second state, the values of both these inductors being different.

In another alternative, it is also possible that the resonating structure 130 includes a first and a second inductor with different values, and a first and a second capacitor having different capacitance values, the first inductor being electrically coupled to the first capacitor in the first state, and the second inductor being electrically coupled to the second capacitor in the second state.

The electrical element 132 corresponds to an MOS type differential twisted pair, here formed by two NMOS transistors at which an output 148 of the switchable ILO 104 is located.

The injection circuit 134 includes a DC current blocking capacitance 150 coupled to a resistor 152. The first periodical signal is intended to be applied to a first terminal of the capacitance 150. A bias voltage, defining the bias current of the element 132, is applied to a first terminal of the resistor 152, and a second terminal of the resistor 152 is connected to a second terminal of the capacitance 150 and to the gate of a third NMOS transistor 154. The drain of the third NMOS transistor 154 is connected to the electrical element 132.

Alternatively, the third NMOS transistor 154 may have its source and drain connected in parallel to the resonating structure 130.

According to another alternative, the injection circuit 134 may include, instead of the third NMOS transistor 154, two MOS transistors the drains of which are connected to the drains of two MOS transistors of the electrical element 132 and the sources of which are connected to a bias current source. In this alternative, the injection circuit 134 also includes the capacitance 150 coupled to the resistor 152 analogously to the configuration previously described in connection with FIG. 9. The first periodical signal is intended to be applied to the first terminal of the capacitance 150 and a bias voltage is intended to be applied to the first terminal of the resistor 152, the second terminal of the resistor 152 being connected to the second terminal of the capacitance 150 and to the gates of two MOS transistors of the injection circuit 134 (the first periodical signal being in this case a differential signal).

The values of the inductor 140 and the electrical capacitances of the first capacitor 142 and the second capacitor 144 are chosen such that the free oscillation frequency of the switchable ILO 104 in the first state (first capacitor 142 coupled to the inductor 140) is close or equal to $f_a$, and such that the free oscillation frequency of the switchable ILO 104 in a second state (second capacitor 144 coupled to the inductor 140) is close or equal to $f_b$.

Thus, the switchable ILO 104 which receives at the input the first periodical signal including two main lines at the frequencies $f_a$ and $f_b$ outputs a frequency-stable periodical signal and with a frequency $f_a$ or $f_b$ depending on the state in which the resonating structure 130 is. The frequency of the output signal of the switchable ILO 104 can be easily and quickly switched between $f_a$ and $f_b$ by changing the state in which the resonating structure 130 is. The switchable ILO 104 behaves as a very selective band-pass filter through the locking made to the frequency $f_a$ or $f_b$.

Figure 10:
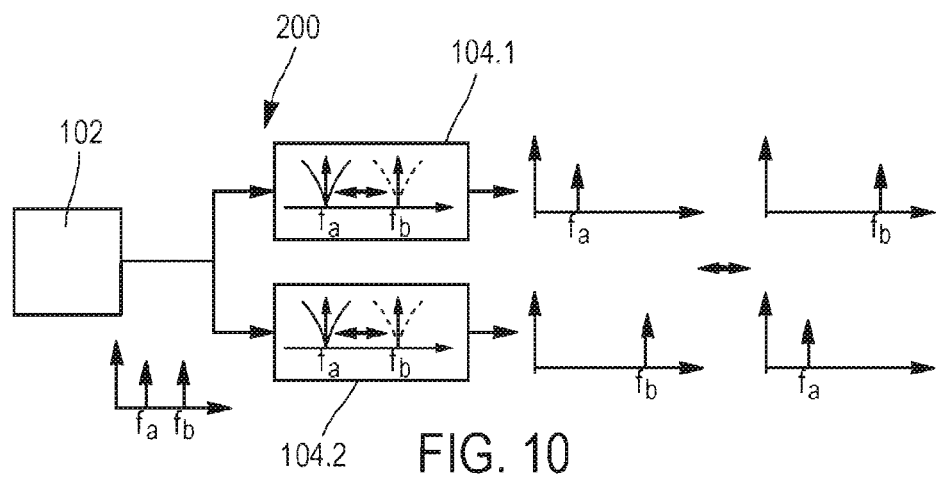
FIG. 10 schematically shows a device for generating a frequency-stable signal, object of the present invention, according to a second embodiment of the invention.

FIG. 10 shows a device 200 for generating two frequency-stable signals and the values of the frequencies of which can be modified, according to a second embodiment.

As for the previously described device 100, the device 200 includes the generator 102 generating the first frequency-stable periodical signal the frequency spectrum of which includes two main lines at the frequencies $f_a$ and $f_b$. This first periodical signal is sent to the inputs of two switchable ILOs 104.1 and 104.2, for example similar to the previously described switchable ILO 104. The switchable ILOs 104.1 and 104.2 are controlled such that they can be in two configurations:

in a first configuration, the first switchable ILO 104.1 is locked to the frequency $f_a$ and thus outputs a frequency-stable periodical signal and the frequency spectrum of which includes a single main line centred on $f_a$, and the second switchable ILO 104.2 is locked to the frequency $f_b$ and thus outputs another frequency-stable periodical signal and the frequency spectrum of which includes a single main line centred on $f_b$;

in a second configuration, the first switchable ILO 104.1 is locked to the frequency $f_b$ and thus outputs a frequency-stable periodical signal and the frequency spectrum of which includes a single main line centred on $f_b$, and the second switchable ILO 104.2 is locked to the frequency $f_a$ and thus outputs another frequency-stable periodical signal and the frequency spectrum of which includes a single main line centred on $f_a$.

Thus, regardless of the configuration of the switchable ILOs 104.1 and 104.2, the frequencies at which the main lines of the frequency spectra of the signals obtained at the output of the switchable ILOs 104.1 and 104.2 are located are always different from each other, one being equal to $f_a$ and the other being equal to $f_b$. Such a device 200 is thus well suitable for being used in a transceiver device simultaneously performing transmission and reception of signals in two distinct frequency bands that can be switched over.

Figure 11:
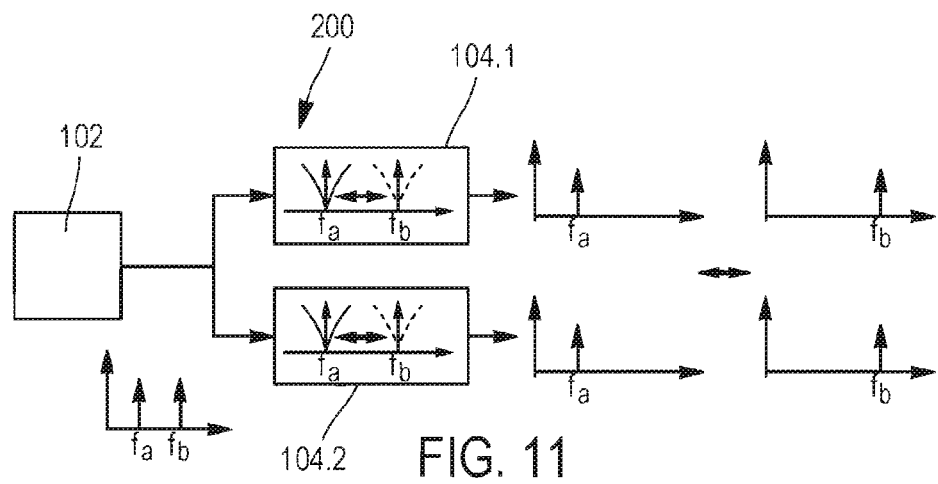
FIG. 11 schematically shows a device for generating a frequency-stable signal, object of the present invention, according to a first alternative of the second embodiment.

In an alternative embodiment of the device 200 shown in FIG. 11, the configurations according to which the switchable ILOs 104.1 and 104.2 are controlled may be such that:

in a first configuration, the first switchable ILO 104.1 and the second switchable ILO 104.2 are locked to the frequency $f_a$ and thus output the frequency-stable periodical signals and the frequency spectra of which include a single main line centred on $f_a$;

in a second configuration, the first switchable ILO 104.1 and the second switchable ILO 104.2 are locked to the frequency $f_b$ and thus output frequency-stable periodical signals and the frequency spectra of which include a single main line centred on $f_b$.

In the previously described devices 100 and 200, the frequency spectrum of the first periodical signal generated by the generator 102 includes two main lines at the frequencies $f_a$ and $f_b$, and the switchable ILO(s) enable(s) frequency-stable periodical signals and with a frequency corresponding to one of both frequencies $f_a$ and $f_b$ at which these main lines are located to be outputted. Alternatively, the frequency spectrum of the first periodical signal generated by the generator 102 may include n main lines located at n distinct frequencies, the generator 102 involving in this case several PLL or oscillators and frequency mixers. In this case, the device may include a higher number of switchable ILOs each able to be locked to at least two of said n frequencies depending on the state in which the switchable ILO is, to output a higher number of frequency-stable output signals and/or the ILO(s) of which is (are) able to be locked to more than two frequencies in order to obtain at the output one or more stable periodical signals the frequency of which can assume more than two values.

Figure 12:
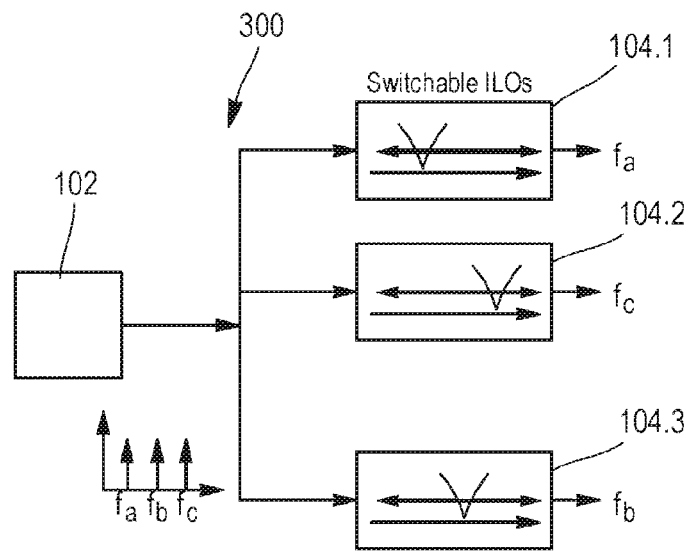
FIG. 12 schematically shows a device for generating a frequency-stable signal, object of the present invention, according to a third embodiment of the invention.

FIG. 12 shows a device 300 in which the signal outputted by the generator 102 includes three main lines at the frequencies $f_a$, $f_b$ and $f_c$, and three switchable ILOs 104.1, 104.2 and 104.3 each able to be locked to one of the three frequencies $f_a$, $f_b$ and $f_c$ (for example via using three capacitances with different values in the resonating structures of these switchable ILOs). The frequencies obtained on the three outputs of the switchable ILOs 104.1, 104.2 and 104.3 may be different from each other (a signal of each of the three frequencies $f_a$, $f_b$ and $f_c$ on the three outputs) or at least partly similar (for example one of the output signals to one of the three frequencies $f_a$, $f_b$ and $f_c$ and both other output signals to one of both other frequencies, or the three output signals at the same frequency $f_a$, $f_b$ or $f_c$).

In each of the devices 100, 200 and 300, the outputs of the switchable ILOs 104 may be connected in series to one or more other switchable ILOs in order to improve the spectral purity of the signals obtained at the output of these devices. Indeed, the output signal of such a switchable ILO is mainly comprised of the line to which the switchable ILO is locked, but the rejection of the lines adjacent to the main line is not infinite. The signal obtained at the output of the switchable ILO 104 may correspond not to a pure sinusoidal signal, but to a periodical signal the envelope of which is never zero and the frequency spectrum of which has a main line at the frequency to which the switchable ILO is locked. The secondary lines of this frequency spectrum, located at frequencies multiples of $f_1$, have amplitudes lower than that of the main line of this frequency spectrum. Adding one or more switchable ILOs in series enable these secondary lines to be attenuated or eliminated.

Figure 13:
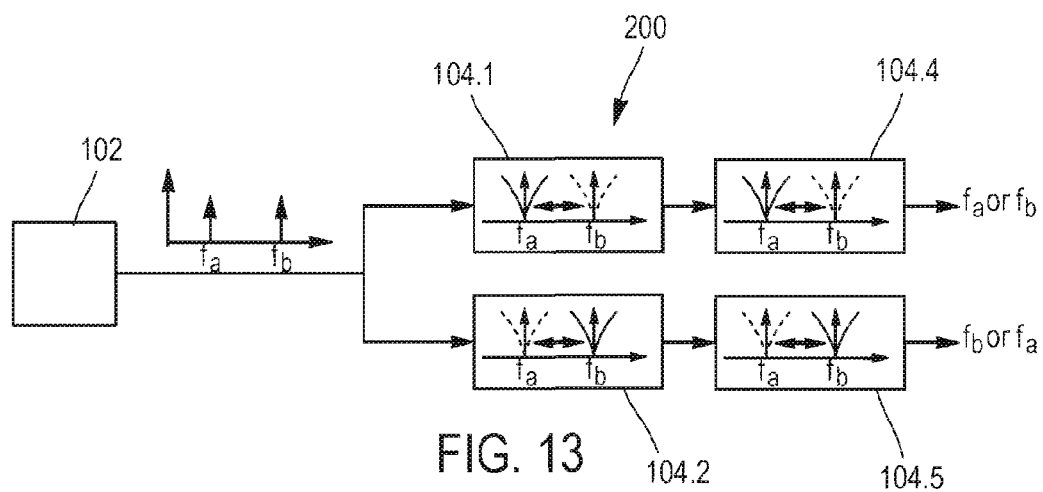
FIG. 13 schematically shows a device for generating a frequency-stable signal, object of the present invention, according to a second alternative of the second embodiment.
Figures 14A, 14B, 14C:
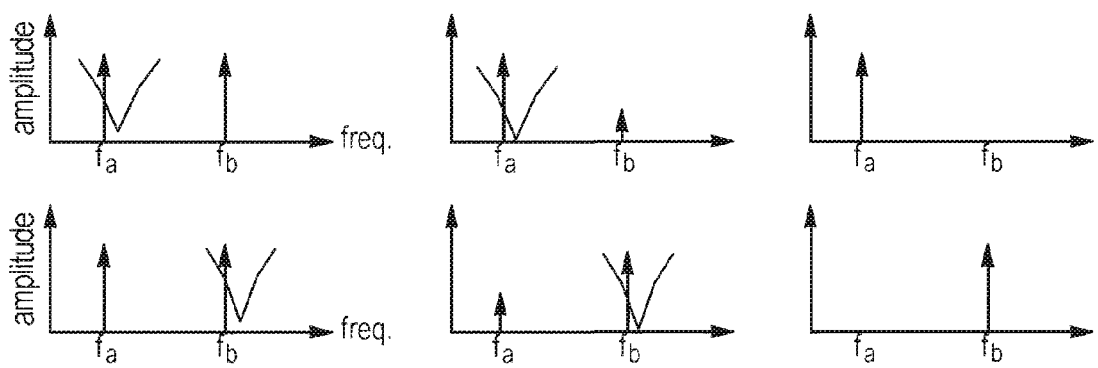
FIGS. 14A to 14C show frequency spectra obtained within a device for generating a frequency-stable signal, object of the present invention, according to the second alternative of the second embodiment.

FIG. 13 shows another alternative of the device 200 previously described in connection with FIG. 10. In this device 200, each of the switchable ILOs 104.1 and 104.2 is connected in series with another switchable ILO 104.4 and 104.5 for example similar to the switchable ILO to which it is connected. The switchable ILO 104.4 is configured in the same locking state as that of the switchable ILO 104.1 (for example to the frequency $f_a$) and the switchable ILO 104.5 is configured in the same locking state as that of the switchable ILO 104.2 (for example at the frequency $f_b$). FIG. 14A shows the spectra of the signals applied at the inputs of the switchable ILOs 104.1 and 104.2, and include two main lines at the frequencies $f_a$ and $f_b$. The locking ranges of the switchable ILOs 104.1 and 104.2 are also symbolically shown in this figure. FIG. 14B shows the spectra of the signals obtained at the outputs of the switchable ILOs 104.1 and 104.2 and applied at the inputs of the switchable ILOs 104.4 and 104.5. It can be seen in this FIG. 14B that lines with low amplitudes are still present at the frequencies to which the switchable ILOs 104.1 and 104.2 were not locked. The locking ranges of the switchable ILOs 104.4 and 104.5 are also symbolically shown in this FIG. 14B. Finally, FIG. 14C shows the spectra of the signals obtained at the outputs of the switchable ILOs 104.4 and 104.5. It can be seen in this FIG. 14C that the lines with low amplitudes which were still present at the frequencies to which the switchable ILOs 104.1 and 104.2 were not locked (FIG. 14B) have disappeared by virtue of the finer "filtering" made via the switchable ILOs 104.4 and 104.5.

Figure 15:
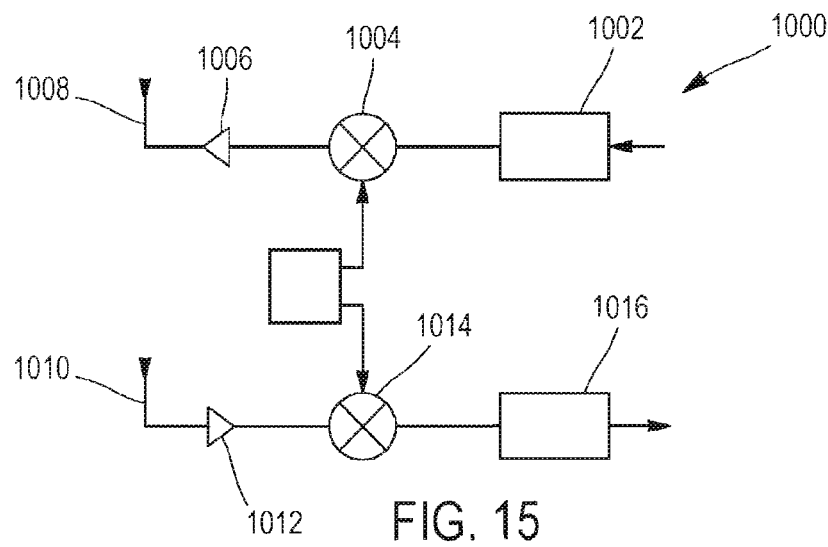
FIG. 15 schematically shows a part of a transceiver device, object of the present invention.

FIG. 15 schematically shows part of an FDD type transceiver device 1000 suitable for the E-Band communication standard and simultaneously operating in transmission and reception in two different frequency bands with a width equal to about 5 GHz and centred about the frequencies 70 GHz and 80 GHz. The device 1000 includes elements used for a signal transmission such as a baseband processing circuit 1002 receiving at the input the information to be transmitted, a modulator 1004, a power amplifier 1006 and a transmitting antenna 1008. The device 200 is for example used with the modulator 1004 in order to modulate the signal at the desired carrier frequency (about the frequency $f_2$ for example). The transmission system 1000 also includes elements used for a signal reception: a receiving antenna 1010, a low noise amplifier 1012, a demodulator 1014 and a baseband processing circuit 1016. The device 200 is also used with the demodulator 1014 in order to demodulate the signal received (about the frequency $f_b$ for example) in baseband. The transmission and reception frequency bands can be easily switched changing the state in which the device 200 is configured.

The previously described device for generating frequency-stable signals may also be used within any transceiver device type involving several frequency-stable signals and with different frequencies and which require to quickly modify these frequencies, for example multi-standard transceiver devices.

The previously described device for generating frequency-stable signals may also be used within an electro-optical transceiver device able to send data via Wavelength Division Multiplexing (WDM), that is by modulating several wavelengths sent via a same optical wave guide. The previously described device for generating frequency-stable signals can in this case be used to extract each wavelength of the signal including the different multiplexed wavelength and route these different signals with different wavelengths towards different outputs. The device for generating frequency-stable signals enables in this case the paths on which the different signals with different wavelengths are routed to be easily and quickly modified.

Figure 16:
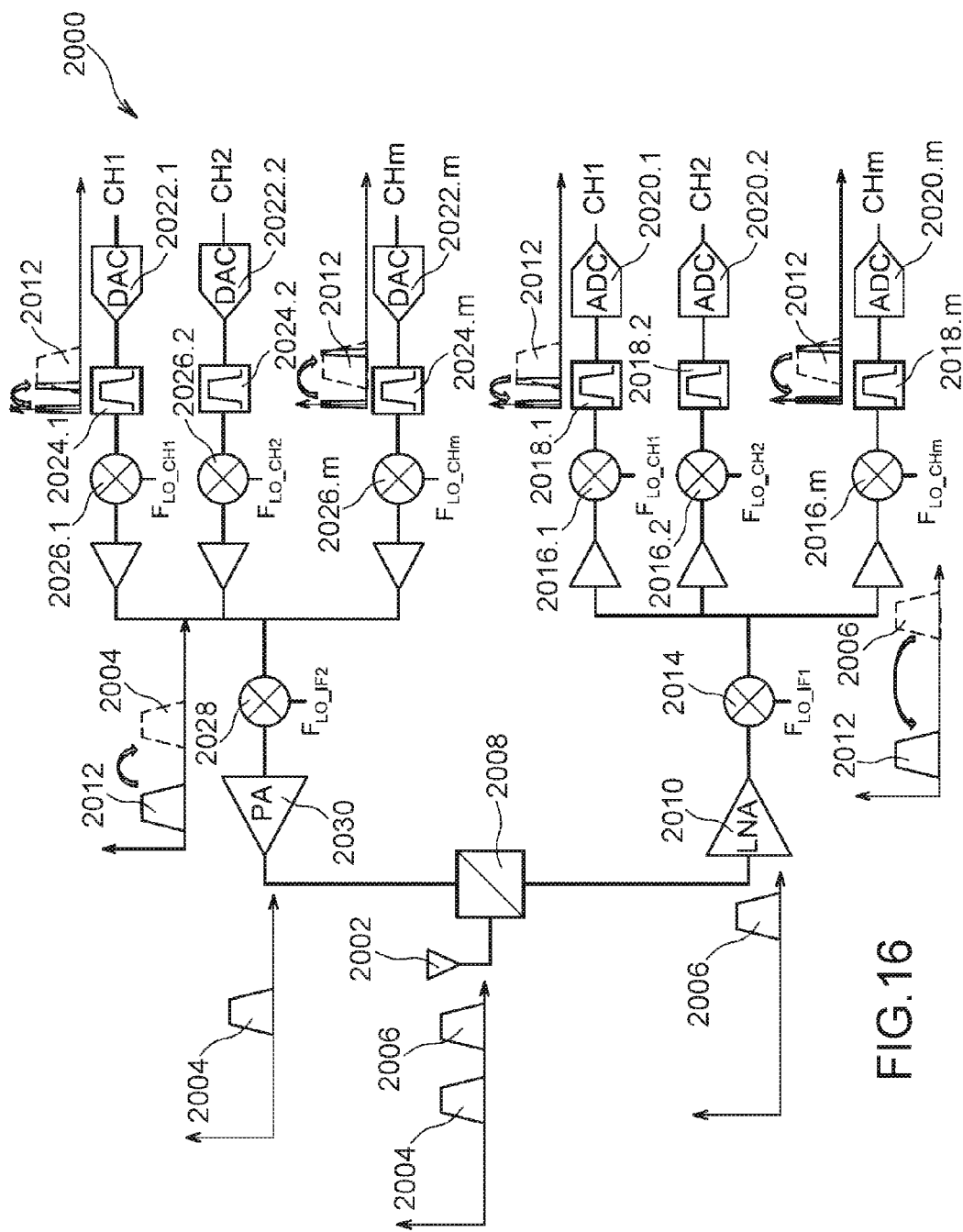
FIG. 16 schematically shows a part of a device for transmitting and receiving signals, object of the present invention, according to a particular embodiment.

The use of a switchable injection-locked oscillator for generating a frequency-stable signal is also advantageous in a transmitting and receiving device 2000 able to perform transmission and reception of signals in two RF transmission frequency bands, for example of the E-band type (transmission in the bands 71-76 GHz and 81-86 GHz), and performing frequency translations using m channels enabling each of these RF bands to be divided into m frequency sub-bands, m being an integer number higher than 1, such as schematically shown in FIG. 16.

The device 2000 includes an antenna 2002 for transmitting and receiving data. In the example described here, the frequencies of the transmission frequency band used for transmitting data, symbolically shown with the reference 2004, are lower than those of the transmission frequency band used for receiving data, symbolically shown with the reference 2006. The low frequency band 2004 used for transmitting data for example corresponds to the band 71-76 GHz, and the high frequency band 2006 used for receiving data for example corresponds to the band 81-86 GHz. Alternatively, the low frequency band 2004 could be used for receiving data and the high frequency band 2006 for transmitting data. The device 2000 also includes an element 2008 enabling the antenna 2002 to operate together with the transmitting elements and receiving elements of the device 2000.

When a signal is received by the antenna 2002, it is sent, via the element 2008, at the input of a Low Noise Amplifier (LNA) 2010, and then translated in an intermediate frequency band 2012 by a mixer 2014 receiving at the input the signal received and a stable periodical signal with the frequency $f_{LO\_IF1}$, called $S_{LO\_IF1}$.

The width of the high frequency band 2006 corresponds to that of the intermediate frequency band 2012. Several analog-digital converters are used to convert the signals located in the different channels of this frequency band. This wide frequency band 2012 is frequency-demultiplexed in order to obtain m less wide frequency sub-bands distributed on m channels each comprising an analog-digital converter enabling the signals transmitted in the different channels of the band 2006 to be retrieved.

This demultiplexing is made on the m channels via a second frequency translation of m parts of the intermediate frequency band 2012 to m lower intermediate frequency bands, or directly in baseband (directly in baseband in the example shown in FIG. 16). In FIG. 16, this demultiplexing or second frequency translation, is made via m mixers 2016.1-2016.m each receiving at the input the signal in the intermediate frequency band 2012 and a stable periodical signal with a centre frequency suitable for the part of the intermediate frequency band 2012 to be recovered and translated in baseband. Each of the mixers 2016.1-2016.m thus receives at the input, in addition to the intermediate frequency signal, a stable periodical signal with a different frequency for each channel, herein with the frequencies $F_{LO\_CH1}$ to $F_{LO\_CHm}$, these signals being called $S_{LO\_CH1}$ to $S_{LO\_CHm}$. The signals in baseband obtained at the output of the mixers 2016.1-2016.m are then individually filtered by band-pass filters 2018.1-2018.m, and then digitally converted by analog-digital converters 2020.1-2020.m, and outputted on the channels CH1 to CHm.

To perform a signal transmission, reverse operations to those made during the previously described reception are implemented. Thus, the signals in baseband of the channels CH1 to CHm are first individually converted by digital-analog converters 2022.1-2022.m, then individually filtered by band-pass filters 2024.1-2024.m, and translated in the intermediate frequency band 2012 via multiplexing in the frequency domain made by mixers 2026.1-2026.m each receiving at the input one of the filtered analog signals and one of the signals $S_{LO\_CH1}$ to $S_{LO\_CHm}$. The thus combined signals located in the intermediate frequency band 2012 form a single signal distributed on the intermediate frequency band 2012. A translation in the frequency band 2004 is then made by a mixer 2028 receiving at the input the signal in the intermediate frequency band 2012 as well as a signal with the frequency $f_{LO\_IF2}$, called $S_{LO\_IF2}$. The output signal of the mixer 2028 is finally amplified by a power amplifier 2030 and then transmitted by the antenna 2002.

The different channels CH1 to CHm operate simultaneously or not upon transmitting or receiving data.

In an FDD type transmitting and receiving device, the intermediate frequency bands used upon transmitting and receiving are similar.

Figure 17:
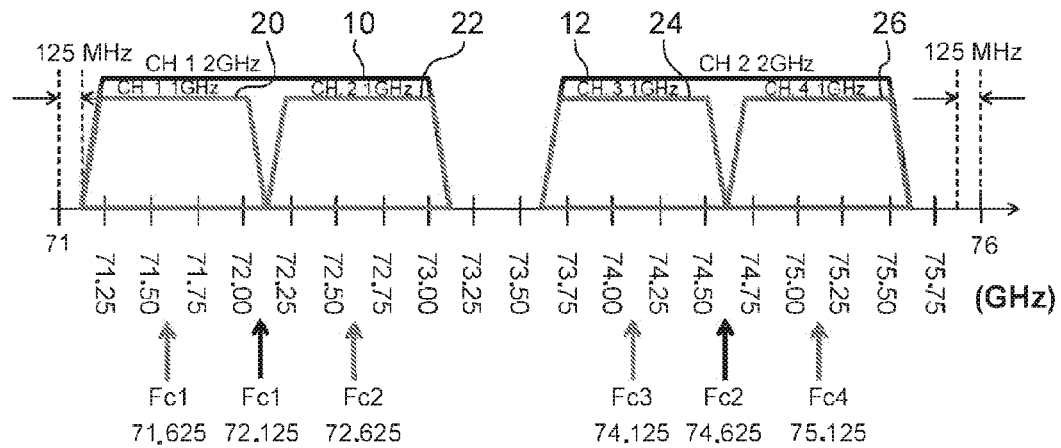
FIG. 17 shows examples of channel distribution in a transmission frequency band used in the device object of the present invention.

FIG. 17 shows two examples of channel distribution in the low transmission frequency bands 71-76 GHz.

It can be seen in this figure a first example in which two channels CH1 and CH2 having the references 10 and 12, each with a width equal to 2 GHz, are used in the band 71-76 GHz. By analogy with FIG. 16, this first example corresponds to a configuration of the device 2000 wherein m=2. In this case, the first channel 10 has a centre frequency $F_{c1}$=72.125 GHz, and the second channel 12 has a centre frequency $F_{c2}$=74.625 GHz. A second example is also shown in which four channels CH1 to CH4 having the references 20, 22, 24 and 26, each with a width equal to 1 GHz, are used (case of FIG. 16 in which m=4). In this case, the first channel 20 has a centre frequency $F_{c1}$=71.625 GHz, the second channel 22 has a centre frequency $F_{c2}$=72.625 GHz, the third channel 24 has a centre frequency $F_{c3}$=74.125 GHz, and the fourth channel 26 has a centre frequency $F_{c4}$=75.125 GHz. It can also be seen in this figure that in any case, guard bands of 125 MHz are present at the ends of the low transmission frequency band. A similar configuration of the channels is found in the high transmission frequency band 81-86 GHz.

Generating the signals $S_{LO\_CH1}$ to $S_{LO\_CHm}$ and the signals $S_{LO\_IF1}$ and $S_{LO\_IF2}$ is made using symmetries which exist between the centre frequencies of the different channels and between the transmission frequency bands 2004 and 2006. Thus, in the two examples shown in FIG. 17, it can be seen that the channel distribution in the band 71-76 GHz is symmetric about the frequency 73.375 GHz, called $F_{CLA}$ (also in the band 81-86 GHZ about the frequency 83.375 GHz, called $F_{CUA}$). In addition, both high and low transmission frequency bands each have a centre frequency (73.5 GHz for the band 71-76 GHz and 83.5 GHz for the band 81-86 GHz) equally distinct from a symmetry frequency called $F_{CA}$, which is equal to 78.5 GHz for the bands 71-76 GHz and 81-86 GHz.

Figure 18:
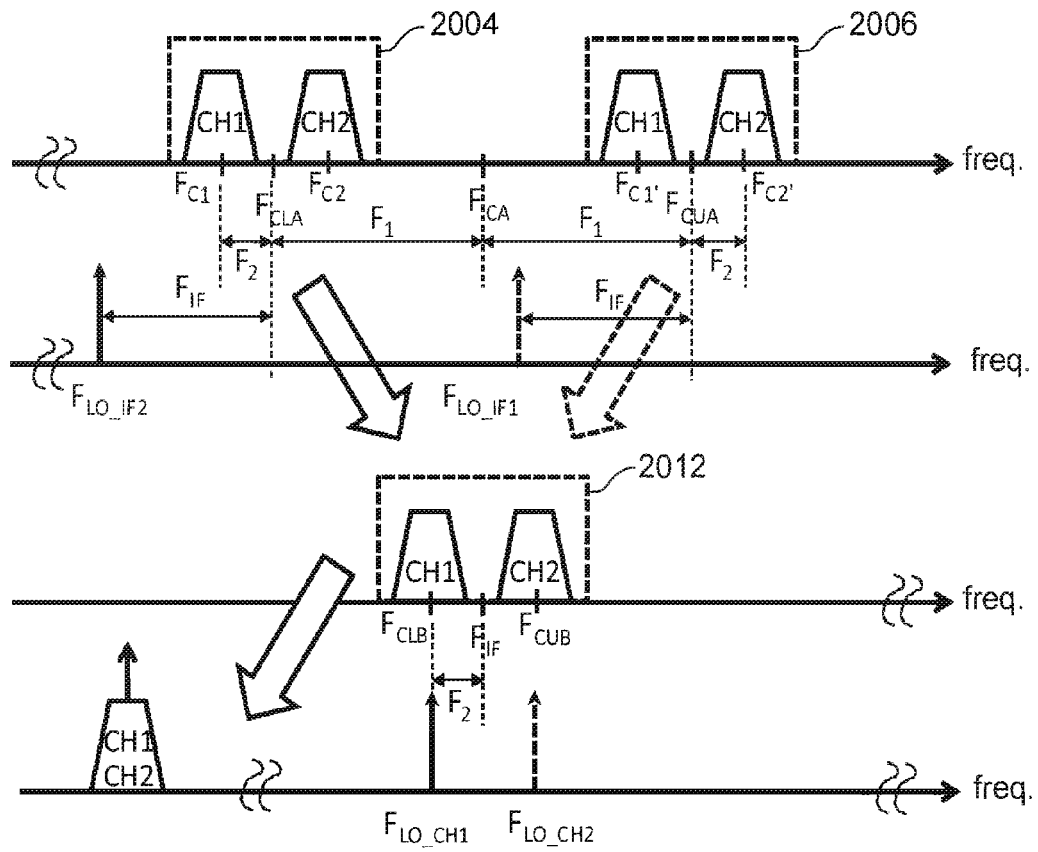
FIG. 18 illustrates the use of symmetries to generate the frequencies used in the device object of the present invention.

FIG. 18 illustrates the principle used for generating the signals $S_{LO\_CH1}$ to $S_{LO\_CHm}$ and the signals $S_{LO\_IF1}$ and $S_{LO\_IF2}$ as a function of the channel distributions in the high and low transmission-reception frequency bands.

In the example of FIG. 18, two channels CH1 and CH2 having a width equal to 2 GHz are present in the low transmission frequency band 2004 (for example the band 71-76 GHz) and are symmetrically arranged in this band on either side of the frequency $F_{CLA}$. This configuration corresponds to the channels 10 and 12 previously described in connection with FIG. 17. The distance between each of the centre frequency $F_{c1}$ and $F_{c2}$ of the channels CH1 and CH2 and the frequency $F_{CLA}$ is called $F_2$.

Likewise, two channels CH1 and CH2 with the same width are present in the high transmission frequency band 2006 (for example the band 81-86 GHz) and are symmetrically arranged in this band on either side of the frequency $F_{CUA}$. The distance between the centre frequencies $F_{c1'}$ and $F_{c2'}$ of these channels and the frequency $F_{CUA}$ also corresponds to $F_2$. Both frequencies $F_{CLA}$ and $F_{CUA}$ are at a same distance from the band symmetry frequency called $F_{CA}$, this distance being called $F_1$.

The frequency $F_{LO\_IF2}$ corresponds to the frequency enabling the translation between the intermediate frequency band 2012 and the low transmission frequency band 2004 to be made. The frequency $F_{LO\_IF1}$ corresponds to the frequency enabling the translation from the high transmission frequency band 2006 to the intermediate frequency band 2012 to be made. The distance between the frequency $F_{LO\_IF2}$ and the frequency $F_{CLA}$, called $F_{IF}$, is equal to that between the frequency $F_{LO\_IF1}$ and the frequency $F_{CUA}$.

The channels which are translated into the intermediate frequency band 2012 have a symmetry about the frequency $F_{IF}$. In the example of FIG. 18, the channels CH1 from the high and low transmission frequency bands 2004 and 2006 both have, after translation in the intermediate frequency band 2012, a same centre frequency $F_{CLB}$ and the channels CH2 both have a same centre frequency $F_{CUB}$. The distance between $F_{IF}$ and one of both these centre frequencies is the same as the previously identified distance $F_2$.

Switching between the intermediate frequency band 2012 and the baseband for the channels is made from the frequencies $F_{LO\_CH1}$ and $F_{LO\_CH2}$. Both these frequencies are symmetric with respect to the frequency $F_{IF}$.

Analogous symmetries are present by considering that each of the channels CH1 and CH2 described in connection with FIG. 18 corresponds to a train of at least two channels.

The device 2000 thus includes a frequency synthesis device enabling the frequency-stable periodical signals $S_{LO\_IF1}$, $S_{LO\_IF2}$, and $S_{LO\_CH1}$ to $S_{LO\_CHm}$ in the previously described example to be simultaneously generated, with a minimum number of elements by virtue of the identified symmetries. This frequency synthesis device generates these signals by combining two frequency components, one enabling the centre of symmetry to be obtained and the other corresponding to the spacing between this centre and the desired frequencies. For this, the frequency synthesis device includes two parts, each based on a PLL, one enabling the signals with the frequencies $F_{LO\_IF1}$ and $F_{LO\_IF2}$ to be generated, and the other enabling the signals with the frequency $F_{LO\_CH1}$ to $F_{LO\_CHm}$ to be generated.

FIG. 19 shows such a frequency synthesis device 400 according to a first embodiment.

The device 400 includes a first PLL 402. A very frequency-stable reference periodical signal, for example from a quartz resonator, with a frequency $F_{ref}$ is applied to a first input of a phase comparator 404 (PFD for "Phase Frequency Detector"). The output signals from the phase comparator 404 are sent at the input of a charge pump circuit 406 and then of a low pass filter 408. The filter 408 outputs a signal applied at the input of an oscillator 410, herein a VCO (Voltage Controlled Oscillator), for example made as differential twisted pairs (resonator coupled with a negative resistance) outputting a sinusoidal signal with the frequency $F_A$. This signal with the frequency $F_A$ is used for generating signals with the frequencies $F_{LO\_IF1}$ and $F_{LO\_IF2}$. This signal is applied at the input of a first frequency divider 412 making a frequency division by a factor N1 corresponding to a number higher than 1, and advantageously an integer number higher than 1. This first frequency divider 412 outputs a signal with a frequency $F_B=F_A/N1$ used for generating signals with the frequencies $F_{LO\_CH1}$ to $F_{LO\_CHm}$ ($F_{LO\_CH1}$ and $F_{LO\_CH2}$ in the example of FIG. 19). This signal is further applied to a second frequency divider 414 making a frequency division by a factor N2 which corresponds to a number higher than 1, and advantageously an integer number higher than 1, and the output of which is connected to a second input of the phase comparator 404. The factor N2 is such that $F_{ref}=F_B/N2=F_A/(N1 \cdot N2)$.

The device 400 includes a second PLL 416. The reference signal with the frequency $F_{ref}$ is applied to a first input of a second phase comparator 418. The output signals of the second phase comparator 418 are sent at the input of a second charge pump circuit 420 and a second high pass filter 422. The second filter 422 outputs a signal applied to the input of a second oscillator 424, here a VCO, outputting a signal with the frequency $F_1$. This signal with the frequency $F_1$ is used for generating signals with the frequencies $F_{LO\_IF1}$ and $F_{LO\_IF2}$. This signal is applied at the input of a third frequency divider 426 making a frequency division by a factor N3 which corresponds to a number higher than 1, and advantageously an integer number higher than 1. This third frequency divider 426 outputs a signal with the frequency $F_2=F_1/N3$ used for generating signals with the frequencies $F_{LO\_CH1}$ and $F_{LO\_CH2}$. This signal is further applied at the input of a fourth frequency divider 428 making a frequency division by a factor N4 which corresponds to a number higher than 1, and advantageously an integer number higher than 1, and the output of which is connected to a second input of the second phase comparator 418. The factor N4 is such that $F_{ref}=F_2/N4=F_1/(N3 \cdot N4)$.

The oscillators 410 and 424 may be made as described in documents "A 60 GHz UWB impulse radio transmitter with integrated antenna in CMOS65 nm SOI technology" by A. Siligaris and al., Silicon Monolithic Integrated Circuits in RF Systems (SiRF), 2011 IEEE 11th Topical Meeting on, pp. 153-156, 17-19 Jan. 2011 and "A 17.5-to-20.94 GHz and 35-to-41.88 GHz PLL in 65 nm CMOS for wireless HD applications" by O. Richard and al., Solid-State Circuits Conference Digest of Technical Papers (ISSCC), 2010 IEEE International, pp. 252-253, 7-11 Feb. 2010.

The frequency dividers 412, 414, 426 and 428 may use different architectures depending on the value of the divided frequency. At high frequencies, the frequency dividers such as the dividers 412 and 414 use CML ("Current Mode Logic") or ILFD ("Injection-Locked Frequency Divider") type circuits. The frequency dividers operating at lower frequencies, for example close to 1 GHz, such as the dividers 426 and 428 use counter type purely digital architectures. If the dividers 426 and 428 operate at higher frequencies, these dividers include for example a first CML type division stage which reduces the frequency to divide, outputting for example a frequency in the order of 1 GHz, and then a second stage forming purely digital dividers. The circuits forming the frequency dividers may be programmable such that the values of the division factors are adjustable, depending on the intended frequencies $F_A$, $F_B$, $F_1$ and $F_2$.

The signals with the frequencies $F_A$ and $F_1$ are applied at the input of a first element 430 making a non-linear operation between these signals and generating a multi-tone, or multifrequency first signal, from these signals. This first element 430 corresponds for example to a mixer making a multiplication of the input signals with the frequencies $F_A$ and $F_1$. The first multi-tone signal obtained at the output of the first element 430 thus includes, in its frequency spectrum, a first main line at the frequency $F_A-F_1$ which corresponds to the frequency $F_{LO\_IF2}$, and a second main line at the frequency $F_A+F_1$ which corresponds to the frequency $F_{LO\_IF1}$. This first multi-tone signal is sent to the input of a first frequency recovering circuit 432 discarding frequencies other than the frequency $F_{LO\_IF2}$ and outputting the periodical signal with the frequency $F_{LO\_IF2}$, and to the input of a second frequency recovering circuit 434 discarding frequencies other than the frequency $F_{LO\_IF1}$ and outputting the periodical signal with the frequency $F_{LO\_IF1}$.

The signals with the frequencies $F_B$ and $F_2$ are applied at the input of a second element 436 making a non-linear operation between these signals and generating a second multi-tone signal from these signals. This second element 436 corresponds for example to a mixer making a multiplication of the input signals with the frequencies $F_B$ and $F_2$. The second multi-tone signal obtained at the output of the second element 436 thus includes, in its frequency spectrum, a first main line at the frequency $F_B-F_2$ which corresponds to the frequency $F_{LO\_CH1}$, and a second main line at the frequency $F_B+F_2$ which corresponds to the frequency $F_{LO\_CH2}$. This second multi-tone signal is sent to the input of a third frequency recovering circuit 438 discarding frequencies other than the frequency $F_{LO\_CH1}$ and outputting the signal with the frequency $F_{LO\_CH1}$, and to the input of a fourth frequency recovering circuit 440 discarding frequencies other than the frequency $F_{LO\_CH2}$ and outputting the signal with the frequency $F_{LO\_CH2}$.

The frequency recovering circuits 432, 434, 438 and 440 include switchable ILOs able to be locked to the desired frequency and to output the periodical signals with desired frequencies. A switchable ILO acts both as a very selective band-pass filter and as a signal regenerator, via the locking made to the desired frequency.

The frequency recovering circuits 432, 434, 438 and 440 each play the role of a band-pass filter with a very high selectivity, and may each correspond to a switchable ILO or several switchable ILO circuits arranged in cascade.

Thus, at the output of the device 400, signals $S_{LO\_IF1}$, $S_{LO\_IF2}$, and $S_{LO\_CH1}$ to $S_{LO\_CHm}$ with a pure spectrum are obtained, that is including a single line at the desired frequency, the phase of which is locked to that of the reference signal with the frequency $F_{ref}$, all the other undesired components having been discarded outside the frequency spectra of these signals by the frequency recovering circuits 432, 434, 438 and 440. However, the rejection of the lines adjacent to the main line is not infinite in practice.

Thus, the signals $S_{LO\_IF1}$, $S_{LO\_IF2}$, and $S_{LO\_CH1}$ to $S_{LO\_CHm}$ obtained at the output of the frequency recovering circuits 432, 434, 438 and 440 may correspond not to pure sinusoidal signals, but to periodical signals the frequency spectra of which each have a main line at the desired frequency as well as secondary lines located at frequencies multiples of that of the main line. It is possible to increase this rejection by connecting in cascade (that is in series) a switchable ILO with one or more ILOs, being switchable or not, and/or one or more band-pass filters to form each of the frequency recovering circuits 432, 434, 438 and 440, and thus further attenuating the secondary lines from the frequency spectra of the signals obtained at the output of these circuits.

FIG. 20 shows an alternative embodiment of the first PLL 402. In this alternative embodiment, the input of the second frequency divider 414 is not connected to the output of the first frequency divider 412, but is connected to the output of the oscillator 410. In this configuration, the frequencies $F_A$ and $F_B$ are such that $F_B=F_A/N1$ and $F_{ref}=F_A/N2=F_B \cdot N1/N2$.

FIG. 21 shows an alternative embodiment of the second PLL 416. In this alternative embodiment, the input of the fourth frequency divider 428 is not connected to the output of the third frequency divider 426, but is connected to the output of the oscillator 424. In this configuration, the frequencies $F_1$ and $F_2$ are such that $F_2=F_1/N3$ and $F_{ref}=F_1/N4=F_2 \cdot N3/N4$.

The components of the PLLs 402 and 416 are chosen and sized such that the frequencies $F_A$, $F_B$, $F_1$ and $F_2$ of the generated signals are suitable for the channels of the low and high transmission frequency bands used. Indeed, by considering the low transmission frequency band, the frequencies $F_A$ and $F_B$ are such that $F_{CLA}=F_A-F_1+F_{IF}$ and $F_{IF}=F_B=F_A/N1$. The frequency $F_A$ is thus such that $F_A=N1 \cdot (F_{CLA}+F_1)/(N1+1)$. By considering the high transmission frequency band, the frequencies $F_A$ and $F_B$ can also be characterized such that $F_{CUA}=F_A+F_1+F_{IF}$, with still $F_{IF}=F_B=F_A/N1$. The frequency $F_A$ is thus also such that $F_A=N1 \cdot (F_{CUA}-F_1)/(N1+1)$. The $F_{CLA}$, $F_{CUA}$, $F_1$ and $F_2$ values correspond to specifications coming from the channel configuration (number, width) used in the transmission and reception frequency bands. For example, in the case of an E-band type transmission with channels with a width equal to 1 GHz or 2 GHz (corresponding to the examples described in connection with FIG. 17), these frequencies are $F_{CLA}=73.375$ GHz, $F_{CUA}=83.375$ GHz, $F_1=5$ GHz, and $F_2=1.25$ GHz.

Alternatively, it is possible that the device 400 includes, instead of the two PLLs 402 and 416, a single PLL for generating the signals with the frequencies $F_A$, $F_B$, $F_1$ and $F_2$. Such a configuration is possible when the $F_A$, $F_B$, $F_1$ and $F_2$ values have a common divider other than 1.

The above principles are applicable when two channels are distributed in each of the transmission frequency bands, but also when more than two channels are distributed in each of these bands provided that their centre frequencies are symmetrically distributed inside each transmission frequency band. In this case, the second multi-tone signal obtained at the output of the second element 436 is used for generating more than two periodical signals having different frequencies.

Figure 22:
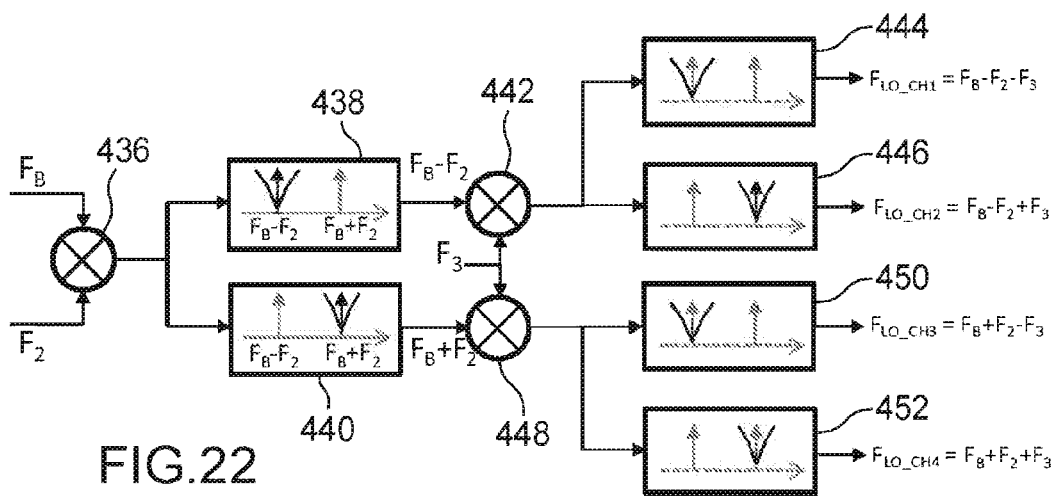
FIG. 22 shows a part of a frequency synthesis device being part of a transmitting and/or receiving device, object of the present invention, enabling data to be transmitted on four channels in each of the transmission frequency bands.

FIG. 22 shows part of the device 400 in which the second multi-tone signal obtained from the periodical signals with the frequencies $F_B$ and $F_2$ enable more than two periodical signals having different frequencies (four in the example of FIG. 22) to be generated.

As in the previously described example, the signals with the frequencies $F_B$ and $F_2$ are applied at the input of the second element 436 (here a mixer).

The second multi-tone signal obtained at the output of the second element 436 is applied at the input of two frequency recovering circuits 438 and 440 (here switchable ILOs) outputting the signals with the frequencies $F_B-F_2$ and $F_B+F_2$. The signal outputted from the third frequency recovering circuit 438 is applied at the input of a third element 442 (here a mixer) making a non-linear operation between the signal with the frequency $F_B-F_2$ and a periodical (for example sinusoidal signal) with the frequency $F_3$ and generating a third multi-tone signal the frequency spectrum of which includes two main lines with the frequencies $F_B-F_2-F_3$ and $F_B-F_2+F_3$. This third multi-tone signal is then applied at the input of a fifth frequency recovering circuit 444 (here a switchable ILO) discarding from the frequency spectrum the frequencies other than the frequency $F_B-F_2-F_3$ and outputting a periodical signal with the frequency $F_{LO\_CH1}=F_B-F_2-F_3$, as well at the input of a sixth frequency recovering circuit 446 discarding from the frequency spectrum frequencies other than the frequency $F_B-F_2+F_3$ and outputting a periodical signal with the frequency $F_{LO\_CH2}=F_B-F_2+F_3$. In parallel with this, the signal outputted from the fourth frequency recovering circuit 440 is applied at the input of a fourth element 448 (here a mixer) making a non-linear operation between the signal with the frequency $F_B+F_2$ and the signal with the frequency $F_3$ and generating a fourth multi-tone signal the frequency spectrum of which includes two main lines at the frequencies $F_B+F_2-F_3$ and $F_B+F_2+F_3$. This fourth multi-tone signal is then applied at the input of a seventh frequency recovering circuit 450 (here a switchable ILO) discarding from the frequency spectrum frequencies other than the frequency $F_B+F_2-F_3$ and outputting the signal with the frequency $F_{LO\_CH3}=F_B+F_2-F_3$, as well at the input of an eighth frequency recovering circuit 452 discarding from the frequency spectrum frequencies other than the frequency $F_B+F_2+F_3$ and outputting the signal with the frequency $F_{LO\_CH4}=F_B+F_2+F_3$. At least one of the frequency recovering circuits 438, 440, 444, 446, 450 and 452 is switchable ILO. The circuit(s) which is (are) not switchable ILOs may be non-switchable ILO or band-pass filters.

The $F_3$ value is chosen depending on the desired values of $F_{LO\_CH1}$ to $F_{LO\_CHm}$ frequencies.

Figure 23A:
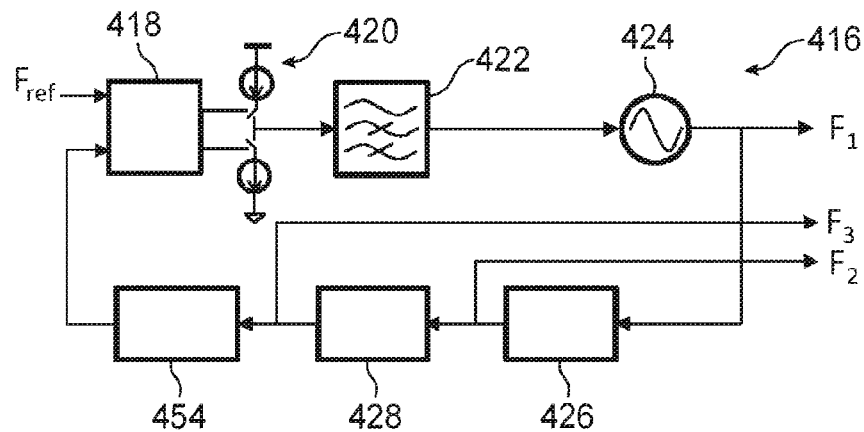
FIGS. 23A and 23B show alternative embodiments of a PLL of a frequency synthesis device being part of a transmitting and/or receiving device, object of the present invention.
Figure 23B:
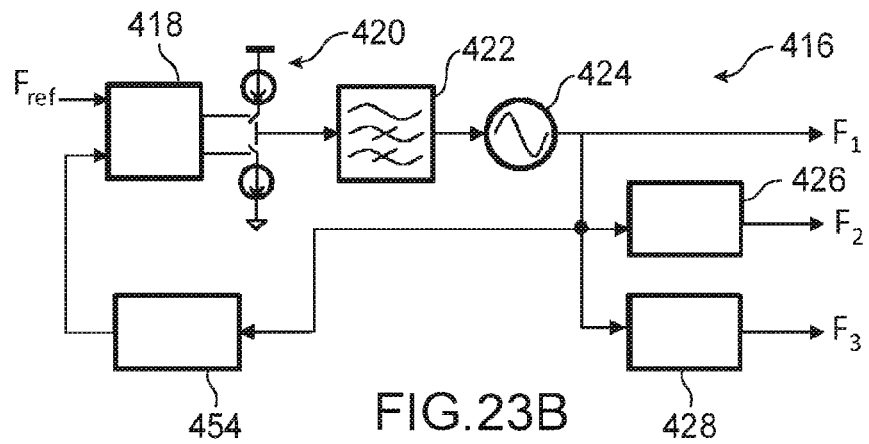

If the frequency $F_3$ has a common divider with the frequencies $F_1$ and $F_2$, the periodical signal with the frequency $F_3$ may be generated from the second PLL 416 which includes in this case a further frequency divider 454 making a frequency division by a factor N5, as is the case in the exemplary embodiments of the second PLL 416 shown in FIGS. 23A and 23B. In the configuration shown in FIG. 23A, the frequencies $F_1$, $F_2$ and $F_3$ are such that: $F_2=F_1/N3$, $F_3=F_2/N4$ and $F_{ref}=F_3/N5=F_2/(N4 \cdot N5)=F_1/(N3 \cdot N4 \cdot N5)$. In the configuration shown in FIG. 23B, the frequencies $F_1$, $F_2$ and $F_3$ are such that: $F_2=F_3/N3$, $F_3=F_1/N4$ and $F_{ref}=F_1/N5=F_2 \cdot N3/N5=F_3 \cdot N4/N5$.

Figure 24:
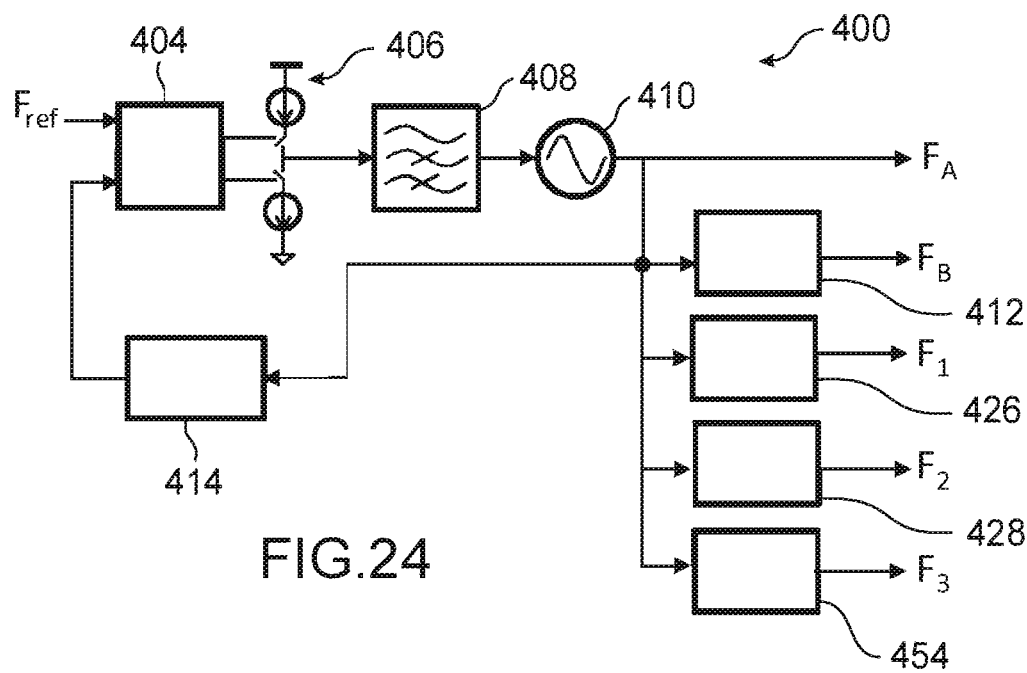
FIG. 24 shows an alternative embodiment of a PLL of a frequency synthesis device being part of a transmitting and/or receiving device, object of the present invention.

It is also possible in this case that the device 400 includes a single PLL for generating the signals with the frequencies $F_A$, $F_B$, $F_1$, $F_2$ and $F_3$. Such a configuration is possible when the $F_A$, $F_B$, $F_3$, $F_2$ and $F_3$ values each have a common divider. Such a configuration is shown in FIG. 24. In this configuration, the values of these frequencies are such that $F_B=F_A/N1$, $F_1=F_A/N2$, $F_2=F_A/N3$, $F_3=F_A/N4$, and $F_{ref}=F_A/N5$. Other configurations of the frequency dividers 412, 414, 426, 428 and 454 are possible while only having a single PLL for generating these periodical signals.

If more than four periodical signals with different frequencies are intended to be generated for the frequency translation between the intermediate frequency band and the baseband (more than four channels in each band transmission frequency band), the signals obtained at the output of at least one part of the frequency recovering circuits 444, 446, 450 and 452 may be sent again at the input of one or more elements making non-linear operations in order to generate new multi-tone signals from which a greater number of periodical signals with different frequencies may be obtained at the output of other frequency recovering elements, based on the same principle as that described above in connection with FIG. 22.

Generally, in the case of an E-band type device, the different components may be sized in different ways, in particular depending on the N1 value chosen. However, all the possible N1 values are not judicious because it must be taken into account that the frequency $F_{IF}$ has to be preferably higher than the width of the transmission frequency band (5 GHz in the case of E-Band) by a factor between about 3 and 10 for making the device 400 more easily. This means that great N1 values can in this case be removed. Further, too low a N1 value generates frequencies $F_A$ and $F_B$ being close, which is less interesting. The table hereinbelow gives values for the frequencies $F_A$ and $F_B$, as well as the ratio of the frequency $F_B$ to the width of the intermediate frequency band (5 GHz in the example described here), for different N1 values, and for $F_A=N1 \cdot (F_{CLA}+F_1)/(N1+1)$ with $F_{CLA}=73.375$ GHz and $F_1=5$ GHz.

| N1 | $F_A$ (GHz) | $F_B$ (GHz) | $F_B$/ BW(IF) |
|---|---|---|---|
| 1 | 39.185 | 39.185 | 7.84 |
| 2 | 52.250 | 26.125 | 5.22 |
| 3 | 58.781 | 19.593 | 3.91 |
| 4 | 62.700 | 15.675 | 3.13 |
| 5 | 65.312 | 13.062 | 2.61 |
| 6 | 67.178 | 11.190 | 2.24 |
| 7 | 68.578 | 9.796 | 1.959 |

The N1 value may advantageously be chosen such that it is equal to 2, 3 or 4. For example, for N1=4, the values of the centre frequencies of the four channels CH1 to CH4 with a width equal to 1 GHz in each transmission frequency band and in the intermediate frequency band are given in the table hereinbelow. In baseband, the centre frequencies of the channels are equal to 0 in transmission and reception.

|  | CH1 | CH2 | CH3 | CH4 |
|---|---|---|---|---|
| Centre frequency in the intermediate frequency band (GHz) | 13.925 | 14.925 | 16.425 | 17.425 |
| Centre frequency in the low transmission frequency band (GHz) | 71.625 | 72.625 | 74.125 | 75.125 |
| Centre frequency in the high transmission frequency band (GHz) | 81.625 | 82.625 | 84.125 | 85.125 |

Also in the case where N1=4, the values of the centre frequencies of both channels CH1 and CH2 with a width equal to 2 GHz are given hereinbelow in the intermediate frequency band and in the transmission frequency bands. In baseband, the centre frequencies of the channels are equal to 0 in transmission and reception.

|  | CH1 | CH2 |
| --- | --- | --- |
| Centre frequency in the intermediate frequency band (GHz) | 14.425 | 16.925 |
| Centre frequency in the low transmission frequency band (GHz) | 72.125 | 74.625 |
| Centre frequency in the high transmission frequency band (GHz) | 82.125 | 84.625 |

An exemplary embodiment of the device 400 as shown in FIG. 19 making a transmission in the bands 71-76 GHz and 81-86 GHz with channels with a width equal to 2 GHz (two channels in each transmission band) is described hereinbelow. The resonator generates a sinusoidal signal with the frequency $F_{ref}=25$ MHz. The oscillator 410 is a VCO generating the sinusoidal signal with the frequency $F_A=62.7$ GHz. The first frequency divider 412 makes a division by a factor N1=4 of the frequency $F_A$, thus outputting a sinusoidal signal with the frequency $F_B=15.675$ GHz. The second frequency divider 414 makes a frequency division by a factor N2=627, thus outputting a sinusoidal signal with a frequency equal to 25 MHz.

The second PLL 416 uses the same signal with the frequency $F_{ref}=25$ MHz as that used in the first PLL 402. The second oscillator 424 is a VCO generating a sinusoidal signal with the frequency $F_1=5$ GHz. The third frequency divider 426 makes a division by a factor N3=4 of the frequency $F_1$, thus outputting a sinusoidal signal with the frequency $F_2=1.25$ GHz. The fourth frequency divider 428 makes a frequency division by a factor N4=50, thus outputting a sinusoidal signal with the frequency equal to 25 MHz.

The elements 430 and 436 are mixers. The output signals of these mixers are sent at the input of frequency recovering circuits 432, 434, 438 and 440 corresponding to switchable ILOs. The first frequency recovering circuit 432 outputs a substantially sinusoidal signal with the frequency $F_{LO\_IF2}=57.7$ GHz. The second frequency recovering circuit 434 outputs a substantially sinusoidal signal with the frequency $F_{LO\_IF1}=67.7$ GHz. The third frequency recovering circuit 438 outputs a substantially sinusoidal signal with the frequency $F_{LO\_CH1}=14.425$ GHz. The fourth frequency recovering circuit 440 outputs a substantially sinusoidal signal with the frequency $F_{LO\_CH2}=16.925$ GHz.

For making a device 400 performing the transmission in the bands 71-76 GHz and 81-86 GHz with channels having a width equal to 1 GHz (four channels in each transmission frequency band), all the elements described above are used and coupled to those previously described in connection with FIG. 22. The third element 442 is a mixer receiving at the input the signal with the frequency equal 14.425 GHz as well as a sinusoidal signal with the frequency $F_3=500$ MHz, and the fourth element 448 is also a mixer receiving at the input the signal with the frequency equal to 16.925 GHz as well as the signal with the frequency $F_3$. The output signals from these mixers are sent at the input of other frequency recovering circuit 444, 446, 450 and 452 corresponding to switchable ILOs. The fifth frequency recovering circuit 444 outputs the substantially sinusoidal signal with the frequency $F_{LO\_CH1}=13.925$ GHz. The sixth frequency recovering circuit 446 outputs a substantially sinusoidal signal with the frequency $F_{LO\_CH2}=14.925$ GHz. The seventh frequency recovering circuit 450 outputs a substantially sinusoidal signal with the frequency $F_{LO\_CH3}=16.425$ GHz. The eighth frequency recovering circuit 452 outputs a substantially sinusoidal signal with the frequency $F_{LO\_CH4}=17.425$ GHz.

In the different previously described examples and embodiments, the frequency recovering elements 432 and 434 generating the signals with the frequencies $F_{LO\_IF2}$ and $F_{LO\_IF1}$ may correspond to switchable ILOs that can be locked to either of both frequencies of the multi-tone signal applied at the input of these elements, as a function of a control signal applied at the input of these switchable ILOs. Thus, it is possible to readily and quickly reverse the frequency bands used for transmitting and receiving data in the device 2000, which is very advantageous in the case of the E-band type transmission device and other FDDs.

Figure 25:
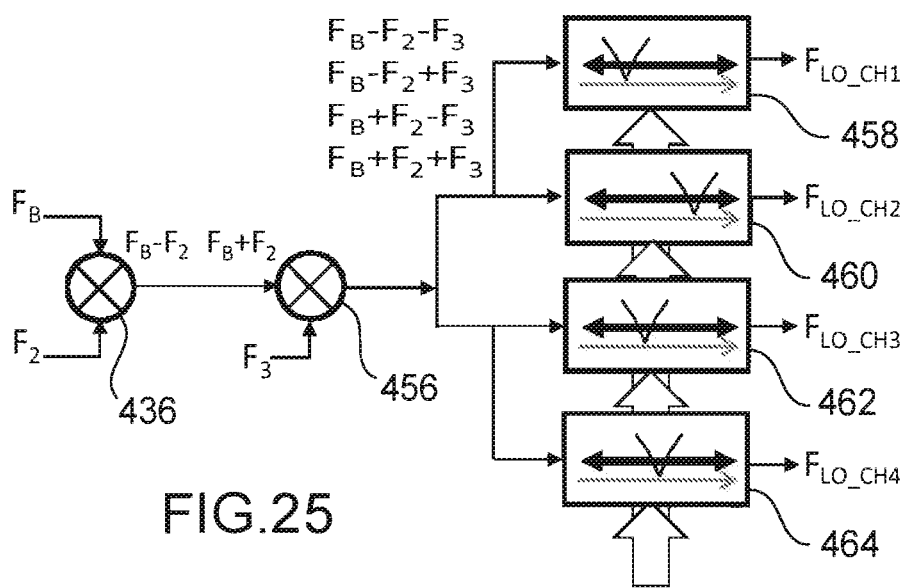
FIG. 25 shows a part of a frequency synthesis device being part of a transmitting and/or receiving device, object of the present invention, enabling data to be transmitted on four channels having variable frequencies in each of the transmission frequency bands.

It is also possible that the selecting elements generating the signals $S_{LO\_CH1}$ correspond to switchable ILOs, that is include a mechanism enabling them to modify their locking range, and thus to be locked to one of the frequencies of the spectrum of the multi-tone signal according to the configuration in which each switchable ILO is. The signal obtained at the output of a switchable ILO is thus a frequency-stable periodical signal, for example a sinusoidal or substantially sinusoidal one, the frequency spectrum of which includes a single main line at the desired frequency according to the configuration in which the switchable ILO is put. This enables, from a frequency point of view, to invert the position of the channels if need be. When each transmission frequency band includes more than two channels, for example four channels, the use of switchable ILOs enable the number of components used for generating the signals $S_{LO\_CH1}$ to be reduced, as shown for example in FIG. 25. Unlike the exemplary embodiment previously described in connection with FIG. 22 in which the output signal from the second element 436 is applied at the input of the third and fourth frequency recovering elements 438 and 440, the output signal from the second element 436 applied at the input of another element 456, for example a mixer, making a non-linear operation between the multi-tone signal including the frequencies $F_B-F_2$ and $F_B+F_2$ and the signal with the frequency $F_3$.

Thus, the multi-tone signal obtained at the output of the element 456 includes in its spectrum four main lines at the frequencies $F_{LO\_CH1}$, that is the frequencies $F_B-F_2-F_3$, $F_B-F_2+F_3$, $F_B+F_2-F_3$ and $F_B+F_2+F_3$. This multi-tone signal is then applied to the input of four switchable ILOs 458, 460, 462 and 464 each able to be locked to one of these frequencies and output a substantially sinusoidal signal with a frequency equal to one of these four frequencies. All the frequency positions of the channels can be switched over with respect to each other depending on the values of the control signals applied to the control inputs of these switchable ILOs. It is also possible that a same frequency is selected by several of the switchable ILOs, for example in the case of a transmitter or receiver working on a single channel at a time which can be selected between the allocated channels in the band covered by the frequency generator.

In the different exemplary embodiments previously described, the multi-tone signals include main lines (corresponding to the frequencies to be recovered by the frequency recovering circuits) with amplitudes being similar and/or in phase with each other, which enables the generated periodical signals to have substantially constant amplitudes and/or phases regardless of the frequency to which each ILO is locked. The lines corresponding to the frequencies to be recovered being main lines of the frequency spectrum of the multi-tone signals (lines with a greater amplitude with respect to the neighbour lines) facilitates locking the ILOs to these lines and avoids locking to a possible other line of the frequency spectrum of these signals. The characteristic according to which the main lines have substantially similar amplitudes may correspond to a voltage difference of about 4 dB maximum between these amplitudes.

Figure 26:
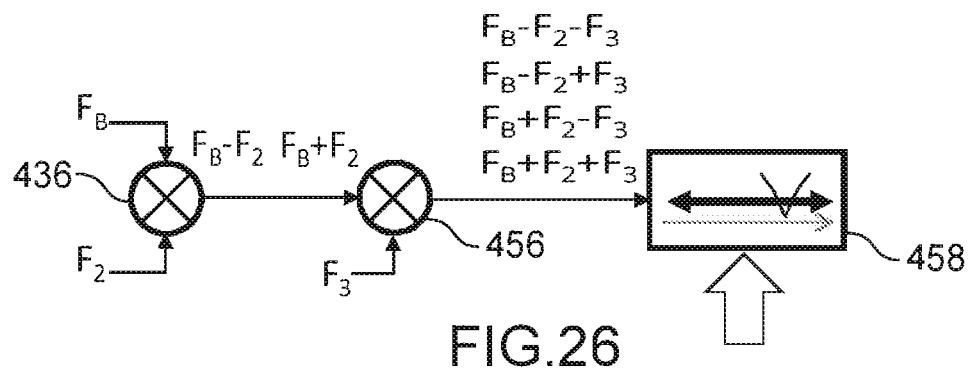
FIG. 26 shows a part of a frequency synthesis device being part of a transmitting and/or receiving device, object of the present invention, enabling data to be transmitted on a channel with a variable frequency in each of the transmission frequency bands.

The use of switchable ILOs may also be contemplated for making variable frequency channels, as shown in FIG. 26. In this figure, a single switchable ILO 458 is used because the device 2000 is intended to operate with a single channel the centre frequency of which can change. Thus, the frequency of the output signal outputted by this switchable ILO 458 may correspond to one of the four frequencies the multi-tone signal outputted by the element 456 includes.

Figure 27:
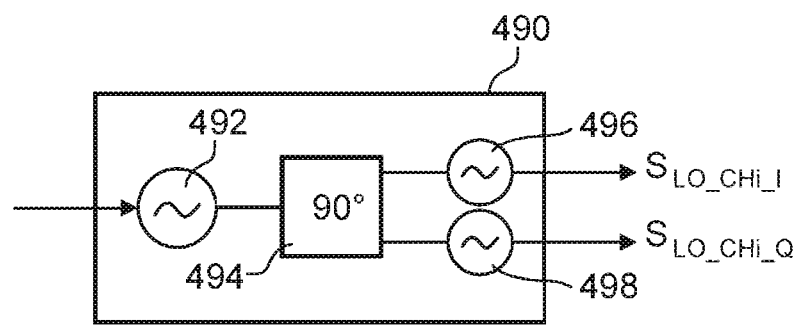
FIG. 27 schematically shows an exemplary embodiment of a frequency recovering circuit enabling I/Q signals with the same frequency to be outputted and used in a transmitting and/or receiving device, object of the present invention.

FIG. 27 shows an exemplary embodiment of a frequency recovering circuit 490 enabling such signals to be outputted. The circuit 490 receives at the input the multi-tone signal including in its spectrum the frequency $F_{LO\_CH1}$ corresponding for example to one of both frequencies $F_B-F_2$ and $F_B+F_2$. The circuit 490 includes a first switchable ILO 492 the input of which receives the multi-tone signal and the output of which is connected to the input of an active or passive type phase shift element 494 enabling the signal applied at the input to be reproduced on one of its both outputs and the signal applied at the input phase shifted by 90° to be generated on the other of both its outputs. Each of both these signals is applied at the input of two other ILOs, being switchable or not, 496 and 498 outputting the signals $S_{LO\_CHi\_I}$ and $S_{LO\_CHi\_Q}$. Both ILOs 496 and 498 operate either independently of each other, or in a coupled way such that the outputs of both ILOs 496 and 498 are phase shifted from each other by 90° without involving the phase shift element 494. The operation of such a Quadrature VCO (QVCO) type element is for example described in document "A 17.5-to-20.94 GHz and 35-to-41.88 GHz PLL in 65 nm CMOS for wireless HD applications" by O. Richard and al., Solid-States Circuits Conference Digest of Technical Papers (ISSCC), 2010 IEEE International, pages 252-253, 7-11 Feb. 2010.

The invention claimed is:

1. A device for generating at least one frequency-stable periodical signal, comprising:
    a generator configured to generate at least one first periodical signal, a frequency spectrum of which includes at least two lines at different frequencies $f_a$ and $f_b$ provided simultaneously in the generated first periodical signal;
    a first switchable injection-locked oscillator configured to receive, at a first input, the first periodical signal and to be locked, in a first state, to the frequency $f_a$, and in a second state, to the frequency $f_b$, as a function of a value of at least one control signal applied at a second input of the first switchable injection-locked oscillator.

2. The device according to claim 1, comprising at least one of features:
    lines at the frequencies $f_a$ and $f_b$ have substantially similar amplitudes;
    lines at the frequencies $f_a$ and $f_b$ are in phase with each other;
    lines at the frequencies $f_a$ and $f_b$ correspond to two main lines of the frequency spectrum of the first periodical signal.

3. The device according to claim 1, wherein the first switchable injection-locked oscillator comprises:
    a resonating structure configured to generate a second periodical signal oscillating, in the first state, at a first free oscillation frequency, and in the second state, at a second oscillation frequency with a value different from that of the first free oscillation frequency;
    an electrical element electrically coupled to the resonating structure with an impedance equivalent to that of a negative electrical resistance;
    an injection circuit electrically coupled to the electrical element, receiving at an input the first periodical signal and configured to provide the electrical element with a current having a frequency equal to that of the first periodical signal.

4. The device according to claim 3, wherein the resonating structure of the first switchable injection-locked oscillator includes at least one LC resonating circuit comprising the following components:
    an inductor coupled in parallel, in the first state, to a first capacitor or, in the second state, to a second capacitor having an electric capacitance with a value different from that of the first capacitor, or
    a capacitor coupled in parallel, in the first state, to a first inductor or, in the second state, to a second inductor with a value different from that of the first inductor, or
    in the first state, a first inductor coupled in parallel with a first capacitor or, in the second state, a second inductor coupled in parallel to a second capacitor, the first inductor having a value different from that of the second inductor and the first capacitor having an electric capacitance with a value different from that of the second capacitor,
    and further comprises switching elements configured to modify couplings of the components of the LC resonating circuit as a function of the control signal.

5. The device according to claim 3, wherein the electrical element of the first switchable injection-locked oscillator comprises an MOS type differential twisted pair.

6. The device according to claim 3, wherein the injection circuit of the first switchable injection-locked oscillator comprises:
    a capacitor including a first terminal to which the first periodical signal is configured to be applied;
    a resistor including a first terminal to which a DC bias voltage is configured to be applied and a second terminal electrically connected to a second terminal of the capacitor;
    an MOS transistor a gate of which is electrically connected to the second terminal of the capacitor and a drain of which is electrically connected to the electrical element of the switchable injection-locked oscillator.

7. The device according to claim 1, wherein the generator comprises:
    a phase-locked loop outputting a third periodical signal with a frequency f1 and a fourth periodical signal with a frequency $f_2=f_1/N_1$, with $N_1$ higher than 1;
    a frequency mixer receiving at an input the third periodical signal and the fourth periodical signal and outputting the first periodical signal such that $f_a=f_1-f_2$ and $f_b=f_1+f_2$.

8. The device according to claim 1, wherein the generator comprises:
    a phase-locked loop outputting a third periodical signal with a frequency $f_1$;
    means to receive at an input the periodical signal with a frequency $f_1$ and to generate at least two signals $S_{G1}$ and $S_{G2}$ in phase with each other and each corresponding to a train of oscillations with a frequency substantially equal to $f_a$ and $f_b$ respectively, with a duration lower than $T_1=1/f_1$ and periodically repeated at the frequency $f_1$,
    an adder configured to output the first periodical signal corresponding to the sum of the signals $S_{G1}$ and $S_{G2}$.

9. The device according to claim 8, wherein the means to receive of the generator includes at least two voltage controlled oscillators with free oscillation ranges that include the frequencies $f_a$ and $f_b$ respectively, and at least two switches connected at power supply inputs of the voltage controlled oscillators and configured to be controlled by the periodical signal with the frequency $f_1$ such that they generate supply non-zero voltages of the voltage controlled oscillators only for part of each period $T_1$ or at least two switches connected to outputs of the voltage controlled oscillators and configured to be controlled by the periodical signal with the frequency $f_1$ such that they break electrical connections between outputs of the voltage controlled oscillators and inputs of the adder for part of each period $T_1$.

10. The device according to claim 1, further comprising at least one second switchable injection-locked oscillator configured to receive at an input the first periodical signal and to be locked in a first state to the frequency $f_b$ and in a second state to the frequency $f_a$, or to be locked in the first state to the frequency $f_a$ and in the second state to the frequency $f_b$, as a function of the control signal applied at the input of the first and second switchable injection-locked oscillators.

11. The device according to claim 1, wherein the frequency spectrum of the first periodical signal includes at least n lines with n different frequencies, and further including n switchable injection-locked oscillators each configured to receive at an input the first periodical signal and to be locked to each of the n frequencies as a function of a value of the control signal applied the input of the n switchable injection-locked oscillators, n being an integer number higher than 1.

12. The device according to claim 1, further comprising at least one third switchable injection-locked oscillator configured to receive at the input an output signal of the first or second switchable injection-locked oscillator or one of the n switchable injection-locked oscillators, and to be locked to a frequency similar to that to which the switchable injection-locked oscillator is locked to which the third switchable injection-locked oscillator is connected.

13. A device for transmitting and/or receiving signals, comprising at least one device for generating a frequency-stable periodical signal according to claim 1, coupled to a modulator and/or a demodulator of the transmitting and/or receiving device.

* * * * *